(12) United States Patent
Sanford et al.

(10) Patent No.: US 8,982,547 B2
(45) Date of Patent: Mar. 17, 2015

(54) ELECTRONIC DEVICES WITH COMPONENT MOUNTING STRUCTURES

(71) Applicant: Apple Inc., Cupertino, CA (US)

(72) Inventors: Emery Sanford, San Francisco, CA (US); Felix Alvarez, San Jose, CA (US); Stephen Brian Lynch, Portola Valley, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/094,600

(22) Filed: Dec. 2, 2013

(65) Prior Publication Data

US 2014/0091336 A1 Apr. 3, 2014

Related U.S. Application Data

(62) Division of application No. 12/870,769, filed on Aug. 27, 2010, now Pat. No. 8,611,077.

(51) Int. Cl.
*H05K 5/00* (2006.01)
*H05K 7/00* (2006.01)
*G06F 1/16* (2006.01)
*H01L 27/12* (2006.01)
*G02F 1/1345* (2006.01)
*G02F 1/1333* (2006.01)

(52) U.S. Cl.
CPC .......... *H01L 27/1255* (2013.01); *G06F 1/1626* (2013.01); *G02F 1/13452* (2013.01); *G02F 2001/133314* (2013.01); *G02F 2001/133317* (2013.01)
USPC .............. 361/679.21; 361/679.26; 361/679.3; 349/58

(58) Field of Classification Search
CPC ....... G06F 1/16; G06F 1/1601; G06F 1/1607; G06F 1/1609; G02F 1/133308; G02F 2001/133317
USPC .............. 361/679.21, 679.26, 679.3, 679.55, 361/679.56; 349/56–60
See application file for complete search history.

(56) References Cited

U.S. PATENT DOCUMENTS

| 4,616,291 A | 10/1986 | Sarnezki et al. |
| 4,761,516 A | 8/1988 | Reichert |
| 5,346,784 A | 9/1994 | Scheid |

(Continued)

FOREIGN PATENT DOCUMENTS

| JP | H02086053 | 3/1990 |
| JP | 2001183633 | 7/2001 |

(Continued)

*Primary Examiner* — Anthony Haughton
(74) *Attorney, Agent, or Firm* — Treyz Law Group; G. Victor Treyz; Kendall P. Woodruff

(57) ABSTRACT

Electronic devices are provided that have components. A housing protrusion may be interposed between a display cover layer and display components. A button may have a button member. A support structure for a dome switch in the button may have a screw hole. A housing may have screw holes through which a screw passes. The screw may also pass through the screw hole of the support structure to hold the switch structure near the button member. A clip may have a spring. A metal plate may prevent the clip from becoming worn by the spring. A display may be mounted on a ledge in a device housing. The ledge may have gaps with supports and removed corners.

18 Claims, 29 Drawing Sheets

(56) References Cited

U.S. PATENT DOCUMENTS

| | | | |
|---|---|---|---|
| 5,455,743 A | 10/1995 | Miyajima | |
| 5,738,954 A | 4/1998 | Latella et al. | |
| 5,996,184 A | 12/1999 | Mah et al. | |
| 6,064,453 A | 5/2000 | Inubushi et al. | |
| 6,477,039 B2 * | 11/2002 | Tajima | 361/679.21 |
| 6,532,152 B1 * | 3/2003 | White et al. | 361/692 |
| 6,843,457 B2 | 1/2005 | Richter | |
| 6,953,891 B2 | 10/2005 | Bolken et al. | |
| 7,173,205 B2 | 2/2007 | Yamamoto | |
| 7,236,357 B2 * | 6/2007 | Chen | 361/679.55 |
| 7,292,434 B2 * | 11/2007 | Chi | 361/679.27 |
| 7,423,878 B2 * | 9/2008 | Kim | 361/704 |
| 7,576,975 B2 * | 8/2009 | Tai et al. | 361/679.21 |
| 7,957,128 B2 * | 6/2011 | Yee et al. | 361/679.21 |
| 8,280,446 B2 * | 10/2012 | Hong et al. | 455/566 |
| 8,339,537 B2 * | 12/2012 | Bo et al. | 349/58 |
| 8,369,702 B2 | 2/2013 | Sanford | |
| 8,456,586 B2 * | 6/2013 | Mathew et al. | 349/58 |
| 8,561,831 B2 * | 10/2013 | Liao | 220/602 |
| 2001/0009498 A1 * | 7/2001 | Oross et al. | 361/681 |
| 2004/0008512 A1 * | 1/2004 | Kim | 362/235 |
| 2004/0130538 A1 | 7/2004 | Lin | |
| 2005/0117283 A1 * | 6/2005 | Lee et al. | 361/681 |
| 2005/0248680 A1 | 11/2005 | Humpston | |
| 2005/0285991 A1 * | 12/2005 | Yamazaki | 349/58 |
| 2006/0291149 A1 * | 12/2006 | Suzuki et al. | 361/679 |
| 2007/0081318 A1 | 4/2007 | Lynch et al. | |
| 2007/0292127 A1 | 12/2007 | Kuhmann et al. | |
| 2008/0131112 A1 | 6/2008 | Aoki et al. | |
| 2008/0166007 A1 | 7/2008 | Hankey et al. | |
| 2008/0297998 A1 | 12/2008 | Choi | |
| 2008/0297999 A1 * | 12/2008 | Choi | 361/681 |
| 2009/0244013 A1 | 10/2009 | Eldershaw | |
| 2010/0231837 A1 | 9/2010 | Harada et al. | |
| 2010/0315570 A1 * | 12/2010 | Mathew et al. | 349/58 |

FOREIGN PATENT DOCUMENTS

| | | |
|---|---|---|
| JP | 2008083491 | 4/2008 |
| JP | 2009069333 | 4/2009 |
| JP | 2009175701 | 8/2009 |
| JP | 2010032653 | 2/2010 |
| JP | 2010113149 | 5/2010 |
| JP | 2010217341 | 9/2010 |
| KR | 10-2008-0106603 | 12/2008 |
| KR | 10-2010-0048187 | 5/2010 |
| WO | 2012027023 | 3/2012 |

* cited by examiner

ELECTRONIC DEVICES WITH COMPONENT MOUNTING STRUCTURES

This application is a divisional of patent application Ser. No. 12/870,769, filed Aug. 27, 2010, which is hereby incorporated by referenced herein in its entirety. This application claims the benefit of and claims priority to patent application Ser. No. 12/870,769, filed Aug. 27, 2010.

BACKGROUND

This relates generally to electronic devices, and, more particularly, to electronic device component mounting features that enhance the performance of electronic devices.

Electronic devices may have displays. Displays may be mounted near to the edges of device housings.

Buttons are used in electronic devices to control device functions such as media playback functions. Buttons are typically mounted in openings in device housings.

Spring-loaded clips may be provided on electronic devices that allow the devices to be attached to items of clothing. Clips may be mounted to device housings using hinges Displays may be provided with cover glass layers that rest on housing ledges. The housing ledges may have gaps to accommodate structures such as screws.

Electronic devices with features such as these may have shortcomings. Device housings may not be configured in a way that allows displays to be placed sufficiently close to device housing edges, button mounting structures may be overly large, spring-loaded clips may have parts that are subject to undesired wear, and display cover layers may be subject to unwanted damage when devices are dropped.

It would therefore be desirable to be able to provide improved electronic device structures.

SUMMARY

A housing for an electronic device may have a protrusion that is interposed between a display cover layer and display components. The display cover layer may be a layer of cover glass. The display components may include a flex circuit cable and a driver integrated circuit. The protrusion may lie over a cavity in a housing. The flex circuit may have a bent portion that is supported by a support structure within the cavity. Capacitors on the flex circuit may be mounted in the cavity.

A button may have a button member. A device housing may have an opening through which the button member passes. A support structure may be provided for a switch such as a dome switch. The dome switch may be actuated when the button member is pressed. The support structure for the dome switch may have a screw hole. A housing may have screw holes through which a screw passes. The screw may also pass through the screw hole in the support structure. This holds the switch structure near the button member.

An electronic device may have a clip. The clip may have a clip member that is attached to a housing structure in the electronic device by a hinge. The hinge may have a torsion spring. A metal plate in the hinge may be interposed between the clip member and the spring to prevent the clip member from becoming worn by the spring.

A display may be mounted on a ledge in a device housing. The ledge may have a ledge surface and gaps. Support structures may be provided in the gaps. The support structures may have recesses that accommodate screws in the device. The support structures may have upper surfaces that lie flush with the ledge surface.

Further features of the invention, its nature and various advantages will be more apparent from the accompanying drawings and the following detailed description of the preferred embodiments.

DETAILED DESCRIPTION

Electronic devices are sometimes provided with displays. Displays may be used to present visual information to a user such as pictures and menu items. If desired, displays may be provided with touch sensors to gather user touch input.

Figure 1:
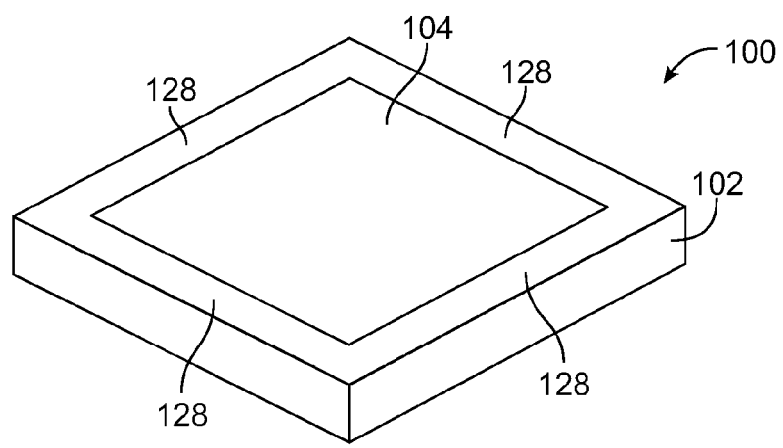
FIG. 1 is a perspective view of an illustrative electronic device that may be provided with a display and display mounting structures in accordance with an embodiment of the present invention.

A perspective view of an illustrative electronic device that may be provided with a display is shown in FIG. 1. As shown in FIG. 1, device 100 may have a housing such as housing 102. Housing 102 may be formed from plastic, metal, carbon fiber composite material, other composites, glass, ceramics, other materials, or combinations of these materials. Housing 102 may be formed from multiple pieces of material or may be formed using a unibody construction in which housing 102 is substantially formed from a single structure (e.g., machined or cast metal, plastic, etc.). Device 100 may be a media player, a cellular telephone, a computer, or other suitable electronic device.

Display 104 may be mounted to the front face of device 100. Portions of housing 102 such as portions 128 may surround display 104. Portions 128 may be integral portions of housing 102 or may be separate structures. For example, portions 128 may be provided by creating a rectangular lip in housing 102 that surrounds all four edges of display 104 or, if desired, portions 128 may be formed from a separate rectangular ring member that is attached to other housing structures. Portions 128 may serve as a cosmetic trim for display 104 and may sometimes be referred to as a bezel structure or a device bezel.

Figure 2:
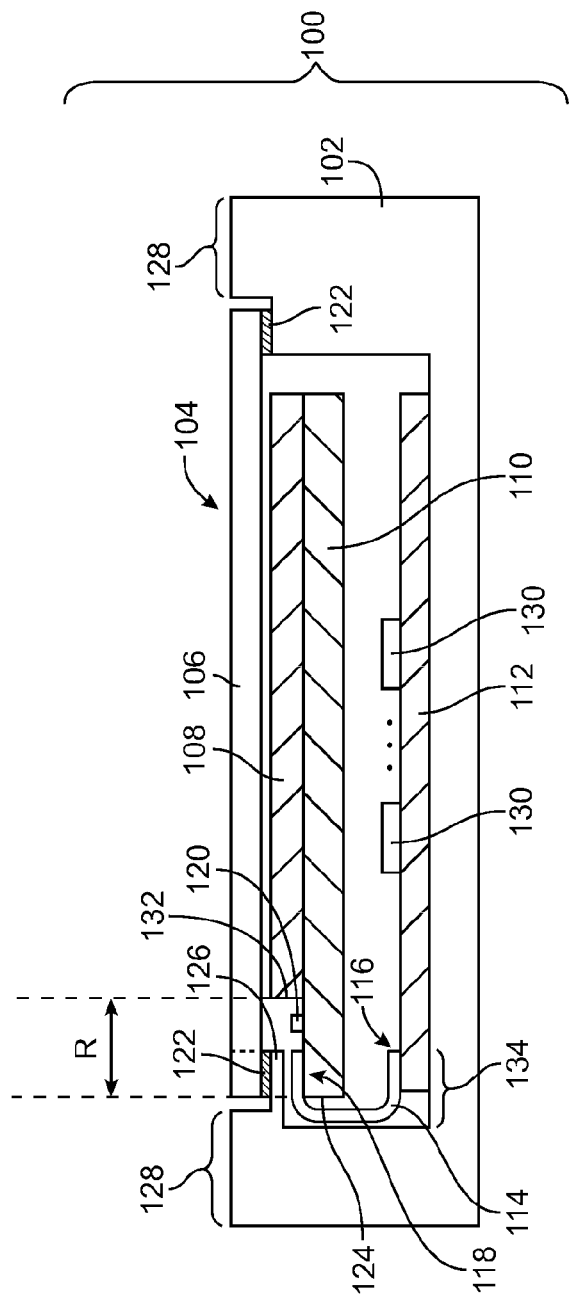
FIG. 2 is a cross-sectional side view of an electronic device of the type shown in FIG. 1 in accordance with an embodiment of the present invention.

To improve device aesthetics and reduce device size, it may be desirable to minimize the width of bezel 128. At the same time, sufficient interior space should be provided within device 100 to accommodate the components that make up display 104. A cross-sectional side view of an illustrative layout that may be used to mount display 104 and its associated structures within device 100 is shown in FIG. 2. As shown in FIG. 2, display 104 may include multiple layers such as layers 110, 108, and 106. These layers may form an image pixel array for displaying images for a user. The layers may include a touch sensor array based on capacitive sensors, resistive sensors, acoustic sensors, piezoelectric sensors, or other sensors.

As shown in FIG. 2, the exposed outer surface of display 104 may be covered with a transparent protective member such as planar transparent cover layer 106. Layer 106 may be formed from plastic, glass, ceramic, or other transparent substances. In a typical scenario, layer 106 may be formed from glass. Layer 106 may therefore sometimes be referred to as a cover glass layer. The use of glass to form protective cover layer 106 is, however, merely illustrative. Other materials may be used in protective layer 106 if desired.

Display 104 may be an organic light-emitting diode (OLED) display, a plasma display, a liquid crystal display (LCD) or other suitable display. The use of LCD technology is sometimes described herein as an example.

In an LCD display arrangement, layer 110 may include a thin-film transistor layer. The thin-film transistor layer may include an array of thin-film transistors formed on a glass substrate. Layer 108 may be a color filter layer that includes an array of colored filter elements. Touch sensor layers may also be incorporated into layer 108 or may be placed adjacent to layer 108. A layer of liquid crystal material may be interposed between layer 108 and layer 110. Electrodes may be used to apply electric fields to image pixels in the liquid crystal layer. Thin-film transistor circuitry on the thin-film layer may be used in driving signals onto the electrodes. A backlight structure and other structures may also be included in display 104.

Driver integrated circuit (IC) 120 may be formed on the outermost surface of thin-film transistor layer 110 (i.e., on the outermost surface of a thin-film transistor substrate layer).

Thin-film transistors and other circuitry for display 104 may be formed on the outermost surface of thin-film transistor layer 110 in the portion of display 104 that is adjacent to color filter layer 108. This circuitry forms an array of image pixel circuits for an image pixel array in display 104. Conductive traces on the surface of layer 110 may be used to interconnect driver IC 120 to the thin-film transistors in the image pixel array. It is generally desirable to form driver IC 120 on the surface of layer 110 to ensure that control signals from driver IC 120 can be driven into the image pixel array without experiencing undesirable parasitic capacitances.

Device 100 may have one or more printed circuit boards such as printed circuit board 112. Circuit board 112 may be formed from a rigid printed circuit board material such as fiberglass-filled epoxy (as an example). Integrated circuits and other components 130 may be mounted on printed circuit board 112. To interconnect the circuitry of board 112 to display 104, a cable such as cable 114 may have one end (end 116) that is connected to board 112 and may have another end (end 118) that is connected to thin-film transistor layer 110. Cable 114 may, if desired, be implemented using a flexible printed circuit ("flex circuit") formed from a sheet of flexible polymer such as polyimide. Flex circuit cable 114 may include a number of conductive traces. Each end of flex circuit cable 114 may be provided with contacts that make electrical connections with mating contacts on board 112 and thin-film transistor layer 110. Connector structures (e.g., flex circuit connectors) may be used in connecting flex circuit cable 114 to traces on board 112 at end 116 and in connecting flex circuit cable 112 to thin-film transistor layer 110 at 118. Connections between cable 112 and the conductive traces on board 112 and thin-film transistor layer 108 may also be formed using conductive adhesive (sometimes referred to as anisotropic conductive film).

Edge 132 of color filter layer 108 (i.e., the color filter glass substrate and any touch sensor electrode substrate and other touch sensor structures that are adjacent to the color filter glass substrate) is preferably recessed by a distance R with respect to edge 124 of thin-film transistor layer 110. This serves to form an exposed region in thin-film transistor layer 110 upon which driver IC 120 may be mounted. The exposed region preferably has a sufficient area to accommodate driver IC 120 and attachment of end 118 of flex circuit cable 114.

To minimize the size of bezel region 128 of housing 102, housing 102 may have a protruding structure such as structure 126. Protrusion 126 serves as a support structure for cover layer 106. On the left-hand edge of cover layer 106 (in the orientation of FIG. 2), pressure sensitive adhesive 122 may be used to attach cover layer 106 to protrusion 126. Along the other edges of cover layer 106 (e.g., along the right-hand edge of cover layer 106 in the orientation of FIG. 2), pressure sensitive adhesive 122 may be used to connect cover layer 106 to other portions of housing 102. To facilitate assembly, the pressure sensitive adhesive that is used to attach cover layer 106 may be placed on cover glass 106 along the left-hand edge prior to assembly and may be placed on housing 102 along the other three edges. Attaching the pressure sensitive adhesive to cover glass 106 along its left-hand edge may help prevent the left-hand edge of cover glass 106 from catching on the pressure sensitive adhesive during assembly.

Because structure 126 has the shape of a protrusion, the region directly below protrusion 126 forms a cavity that can be used to accommodate components in device 100 such as display components. As shown in FIG. 2, for example, there is a region 134 that lies under protrusion 126 (i.e., a region that is located in a more interior location within housing 102 than protrusion 126) and that is available for internal device components. In the FIG. 2 example, cavity region 134 is used to accommodate the left-hand edge of thin-film transistor glass 110, flex circuit cable 114, and the left-hand edge of printed circuit board 112. If desired, other components may be mounted under housing protrusion 126 in region 134. The FIG. 2 arrangement is merely illustrative.

Figure 3:
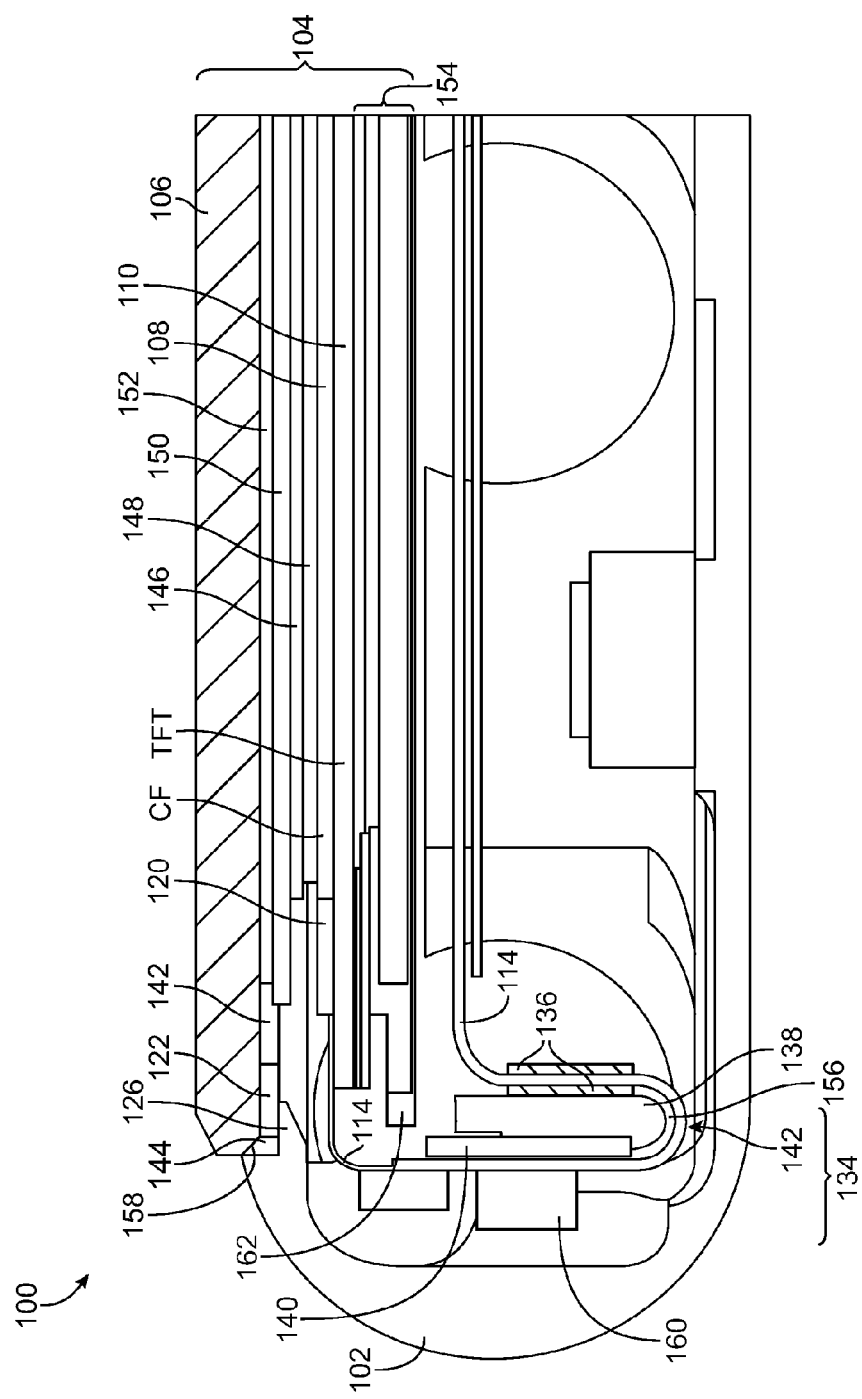
FIG. 3 is a cross-sectional side view of an illustrative electronic device of the type shown in FIGS. 1 and 2 in accordance with an embodiment of the present invention.

FIG. 3 is a cross-sectional side view of an illustrative arrangement that may be used for electronic device 100. As shown in FIG. 3, display layers 104 may include cover glass 106, optically clear adhesive 152, touch sensor array 150 (e.g., a glass substrate with an array of clear electrodes such as indium tin oxide electrodes), optically clear adhesive 146, upper polarizer 148, color filter layer 108, thin-film transistor layer 110, and lower displayer layers 154 (e.g., backlight structures including a back reflector and diffuser layer, a lower polarizer, etc.).

Flex cable 114 may have a bend such as bend 142. Support structure 138 may help support flex cable 114 at bend 142 (e.g., by ensuring that flex cable 114 has a defined minimum acceptable bend radius). Stiffeners such as stiffener 140 may be used in supporting flex cable 114 (e.g., to prevent bends that would weaken solder joints on cable 114). Stiffener 140 may be, for example, a metal stiffener that is formed from a material such as stainless steel. Support structure 138 may be formed from a material such as plastic. For example, support structure 138 may be formed from polycarbonate. Bracket 136 may be formed from a metal such as stainless steel and may be used for mounting plastic support structure 138. Adhesive 156 may be used in attaching flex circuit cable 112 to support structure 138.

Figure 4:
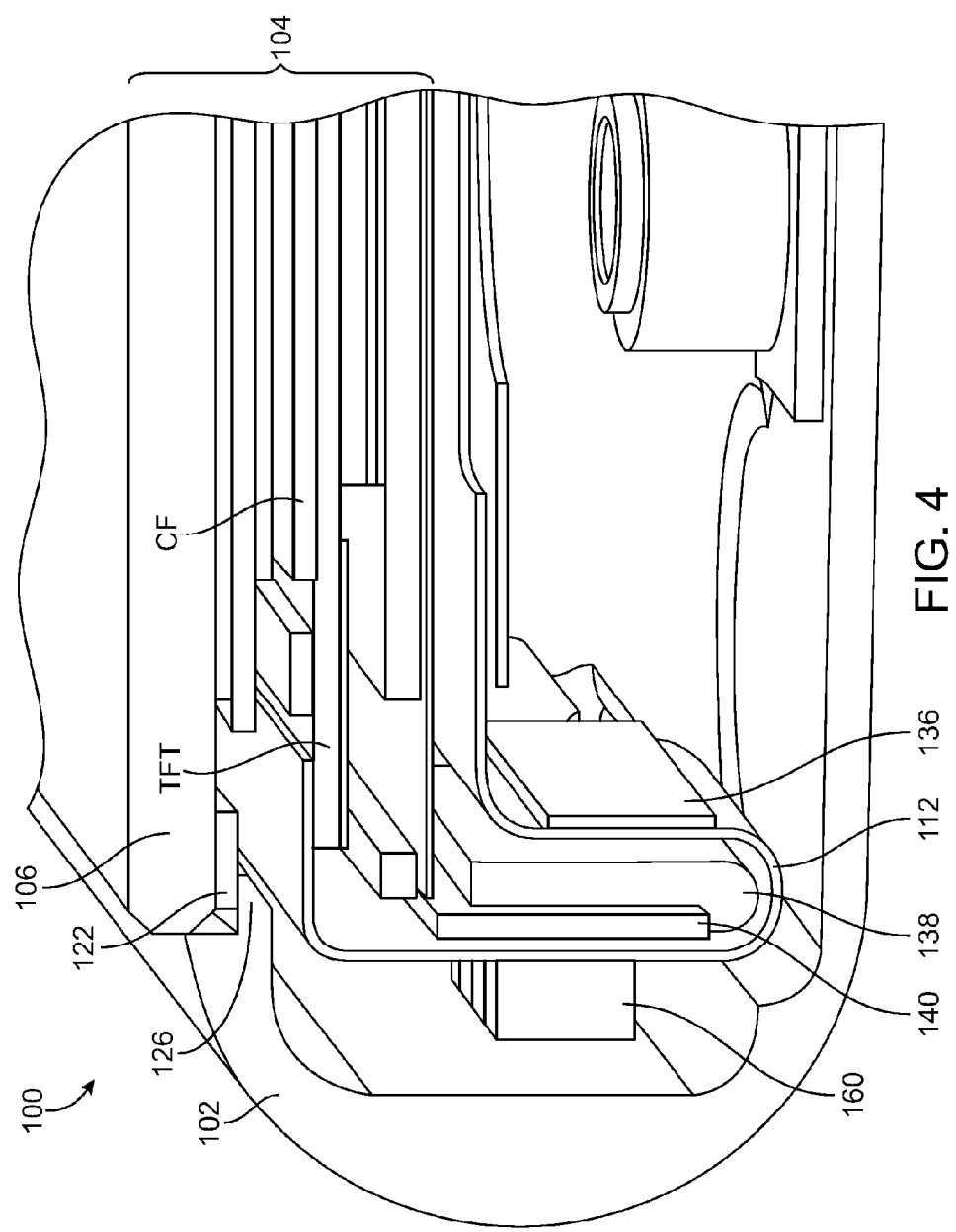
FIG. 4 is a perspective cross-sectional view of the illustrative electronic device of FIG. 3 in accordance with an embodiment of the present invention.

Electrical components such as capacitors 160 may be mounted to flex circuit cable 112 and may be accommodated (along with the other structures shown in FIG. 3) within cavity region 134 under protrusion 126. FIG. 4 is a cross-sectional perspective view of device 100 showing how capacitor 160 may be mounted in the cavity under protrusion 126.

As shown in FIG. 3, portions of display 104 such a portion 162 of backlight layers 154 (sometimes referred to as a p-chassis) may also be accommodated in the cavity (i.e., cavity region 134) that is formed below the overhanging protrusion (protrusion 126).

Air gaps such as air gaps 144 and cover layer lower chamfer 158 may help prevent damage to cover layer 106. Cover layer 106 may have an upper surface that is raised above the uppermost surface of housing 102.

Figure 5:
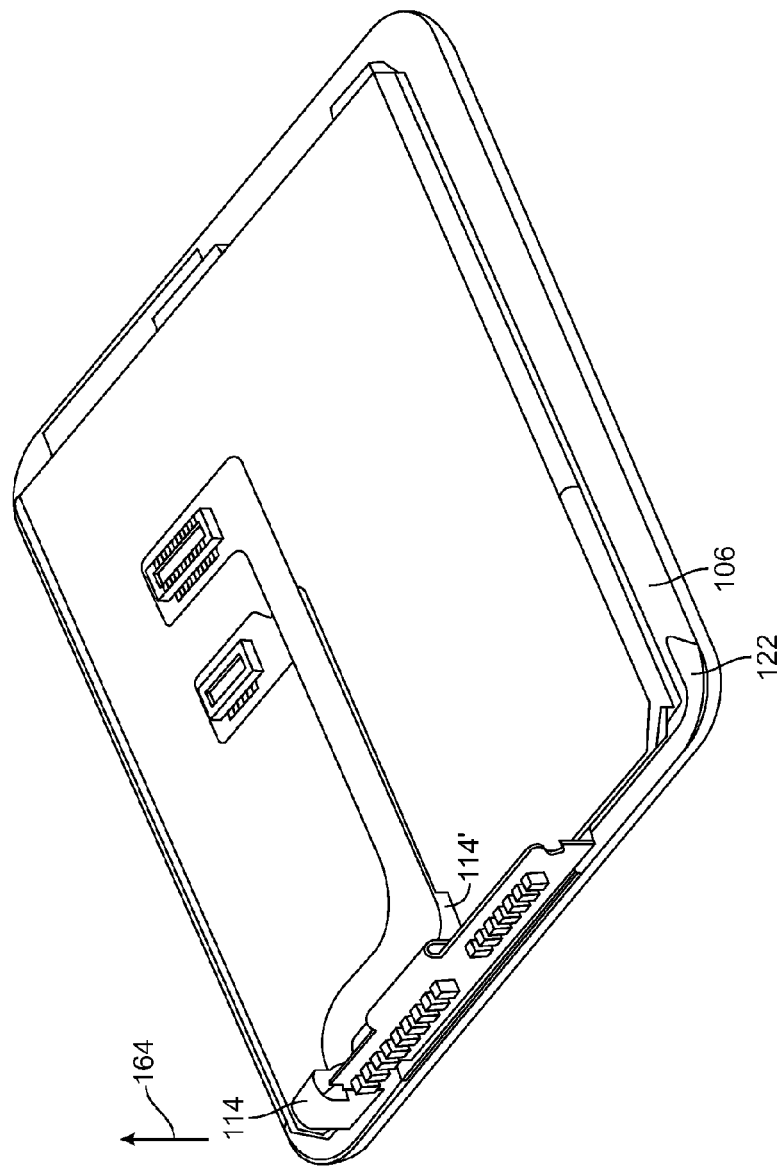
FIG. 5 is perspective interior view of a portion of a display in a device of the type shown in FIGS. 3 and 4 in accordance with an embodiment of the present invention.

A perspective view of cover layer 106 and associated components as viewed from the interior of device 100 (in an unassembled state) is shown in FIG. 5. As shown in FIG. 5, flex circuits such as circuits 114 and 114' may be provided with bends and may have portions that run vertically (i.e., parallel to vertical axis 164, which is perpendicular to the plane of planar cover layer 106 and the other planar layers of planar display 104).

Electronic devices often contain buttons. For example, buttons may be used to make volume adjustments and other media playback adjustments, to make menu selections, to turn the power in a device on and off, and to provide other control functions.

Figure 6:
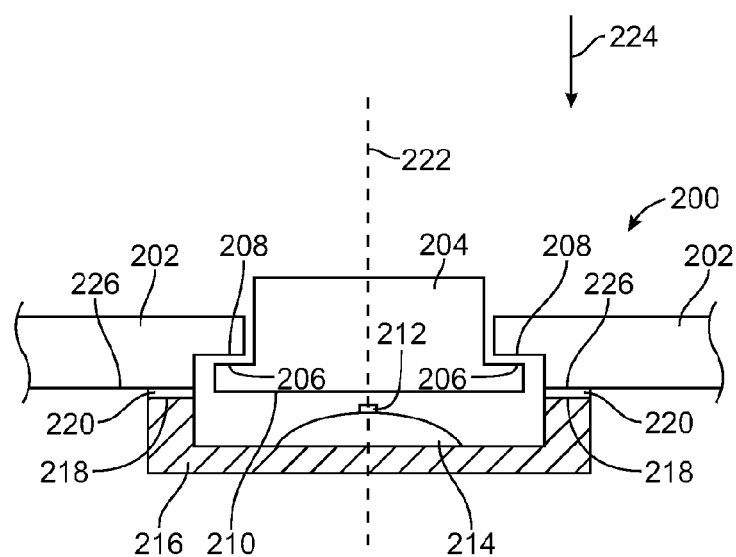
FIG. 6 is a diagram of a conventional button mounted in an opening in a device housing.

A conventional button is shown in the cross-sectional side view of FIG. 6. As shown in FIG. 6, button 200 is formed in an opening in electronic device housing 202. Button 200 has button member 204 that reciprocates along axis 222 during operation. When pressed downwards in direction 224, lower button member surface 210 presses against upper portion 212 of dome switch 214. This collapses dome switch 214 and shorts electrical contacts associated with dome switch 214, "closing" the switch.

Dome switch 214 is mounted on dome switch support member 216. Dome switch support member 216 is attached to the interior surface 226 of housing wall 202 using adhesive 220.

To ensure proper operation of button 200, the dimensions of the structures in FIG. 6 should be well controlled. In particular, the spacing between lower surface 210 of button member 204 and upper surface 212 of dome switch 214 should be accurately controlled. If this spacing is too small, switch 214 may be inadvertently activated. If this spacing is too large, the button may feel loose or it may be difficult to properly close the switch when button member 204 is moved in direction 224.

The distance between lower surface 210 and upper surface 212 is determined by the location of surface 212 and the location of surface 210.

The location of surface 212 relative to housing 202 is affected by the location of inner surface 226 of housing wall 202 and the shape of support 216. This is because surface 218 of support 216 is attached to surface 226. Variations in the location of surface 226 affect the location of surface 218 and therefore the location of surface 212 of switch 214.

The location of surface 210 relative to housing 202 is affected by the location of surface 208 of housing 202. This is because surface 206 of button member 204 bears against surface 208 when button member 204 is not depressed. Careful control of the location of surfaces 226 and 208 and use of accurate dimensions in support structure 216 will ensure that button 200 functions properly.

In compact button designs, there may not be sufficient space available to accommodate a button support structure such as conventional support structure 216 of FIG. 6. A button arrangement of the type shown in FIG. 7 may therefore be used to ensure accurate button operation.

Figure 7:
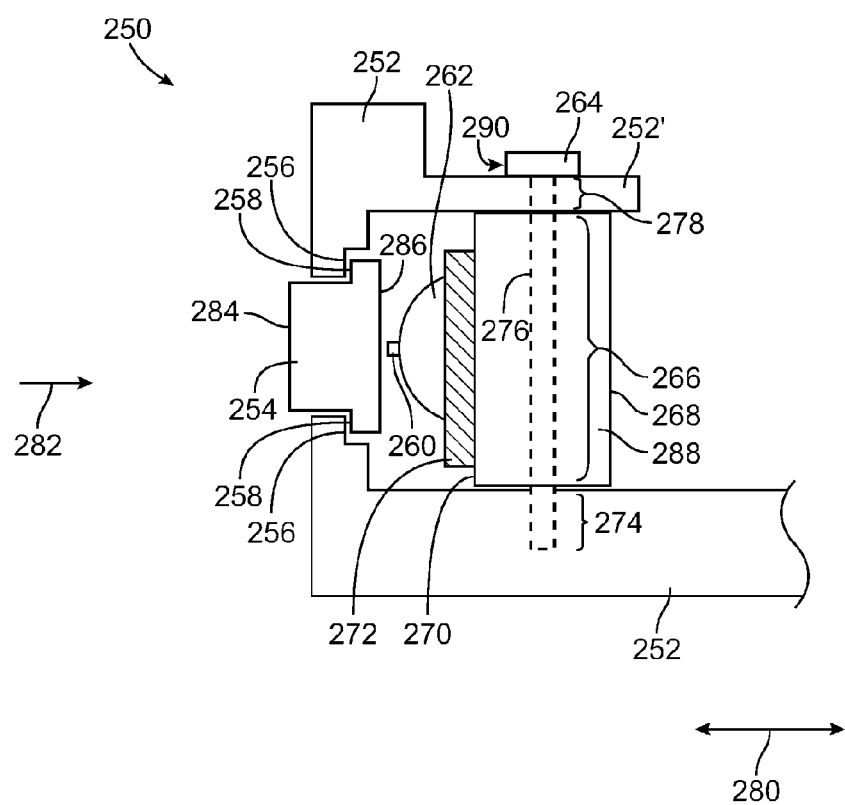
FIG. 7 is a cross-sectional side view of an illustrative button in an electronic device in accordance with an embodiment of the present invention.

As shown in FIG. 7, button 250 may be formed from a button member such as button member 254 that is mounted in an opening in electronic device housing 252. Button 250 may be actuated when a user presses on surface 284 in direction 282. This pushes button member 254 in direction 282 so that inner button member surface 286 presses against outermost surface portion 260 of dome switch 262. When dome switch 262 is collapsed, a conductive inner dome surface in switch 262 may short a pair of switch terminals to each other, thereby closing the switch.

The distance between surface 286 of button member 284 and surface 260 of dome switch 262 affects the operation of button 250. Accurate button operation may be achieved by accurately controlling this distance.

The distance between surface 286 and surface 260 is controlled by the location of surface 286 and the location of surface 260.

The location of surface 286 relative to housing 252 is affected by the location of inner surface 256 of housing wall 252. This is because surface 258 of button member 254 bears against surface 256 when button member 254 is not depressed (i.e., when button member 254 is in its unactuated position).

The location of surface 260 of dome switch 262 relative to housing 252 is controlled by the location of surface 270 of support structure 288. This is because dome switch 262 and its associated flex circuit substrate 272 are mounted on surface 270 (e.g., using pressure sensitive adhesive). The location of surface 270 along dimension 280 therefore controls the location of surface 260 along dimension 280.

To ensure that the location of surface 270 is well controlled relative to housing 252, support structure 288 may be mounted within electronic device housing 252 (and the electronic device formed using housing 252) using one or more elongated members such as screw 264.

Screw 264 may have a head such as head 290 that is attached to a shaft such as shaft 276. Portion 278 of shaft 276 may be smooth (unthreaded) and may pass through an unthreaded cylindrical opening with smooth sidewalls in portion 252' of housing 252. Portion 266 of shaft 276 may be threaded and may engage threads in support structure 288. Portion 274 of shaft 276 may be smooth (unthreaded) and may be received in an unthreaded cylindrical opening in housing 252.

The outer diameter of shaft 276 in regions 278 and 274 and the corresponding inner diameter of the openings through support structure 288 and housing 252 can be accurately controlled during manufacturing, which allows the position of surface 270 along dimension 280 (and therefore the position of surface 260) to be accurately determined.

Figure 8:
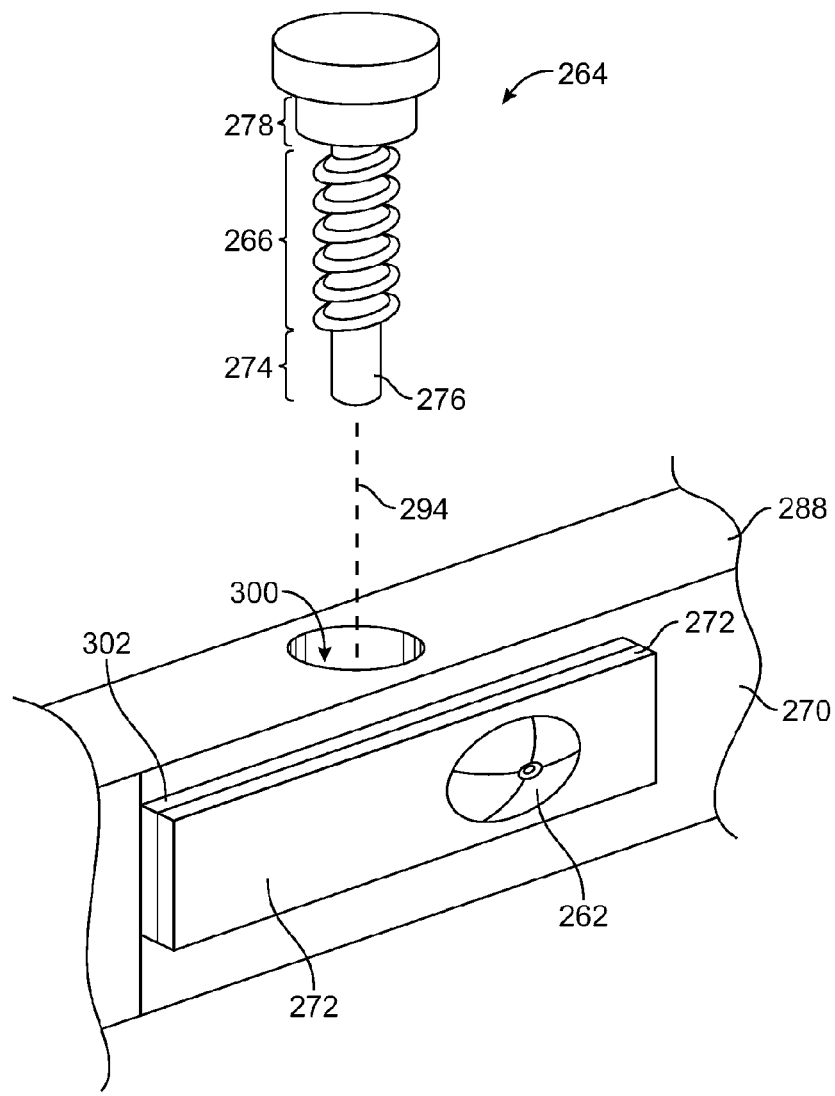
FIG. 8 is an exploded perspective view of an illustrative screw and support structure that may be used in supporting a button switch in an electronic device in accordance with an embodiment of the present invention.

FIG. 8 is an exploded perspective view showing how screws such as screw 264 may be inserted into holes such as hole 300 in support structure 288 along an axis such as axis 294. FIG. 8 also shows how dome switch 262 and dome switch flex circuit 272 to which dome switch 262 is connected may be mounted on front surface 270 of support structure 288. A layer of adhesive such as pressure sensitive adhesive 302 may be used in attaching flex circuit 272 to support 288. Front surface 270 may be a planar surface that lies parallel to longitudinal axis 294 of screw 264.

Figure 9:
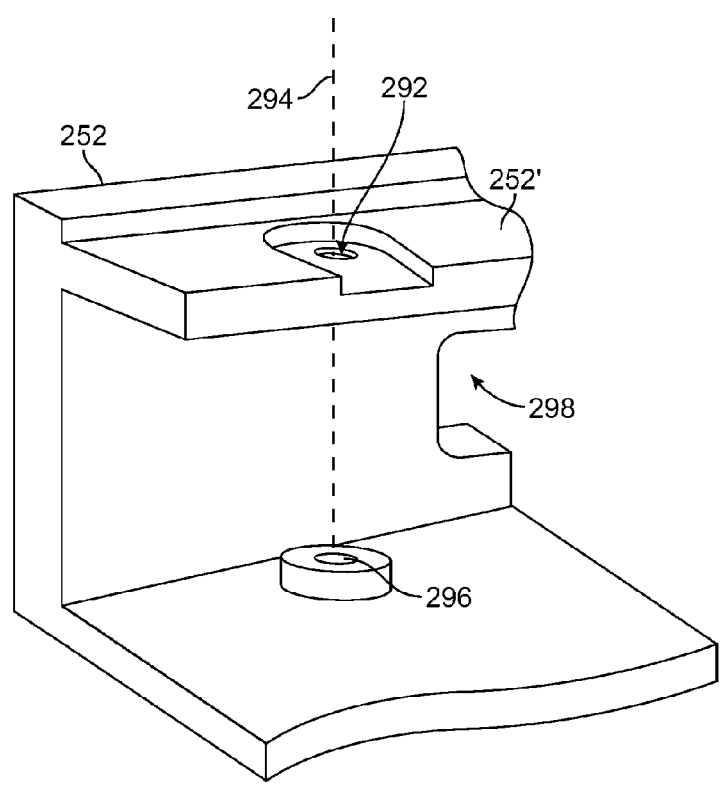
FIG. 9 is a perspective view of an interior portion of an electronic device housing showing holes that may be provided in the housing to receive an elongated cylindrical member such as a screw of the type shown in FIG. 8 in accordance with an embodiment of the present invention.

FIG. 9 is a perspective view of a portion of housing 252 showing how housing 252 may have an opening such as opening 298 to accommodate button member 254. As shown in FIG. 9, screw 264 (FIG. 8) may pass through opening 292 in housing portion 252' along axis 294. When inserted through opening 292 of housing portion 252' and through opening 300 in support structure 288 of FIG. 8, tip portion 274 of screw 264 will be received within hole 296 in housing 252, thereby holding support structure 288 and dome switch 262 in place within device housing 252. Device housing 252 may form a housing for an electronic device such as a cellular telephone, music player, computer, or other electronic equipment.

Figure 10:
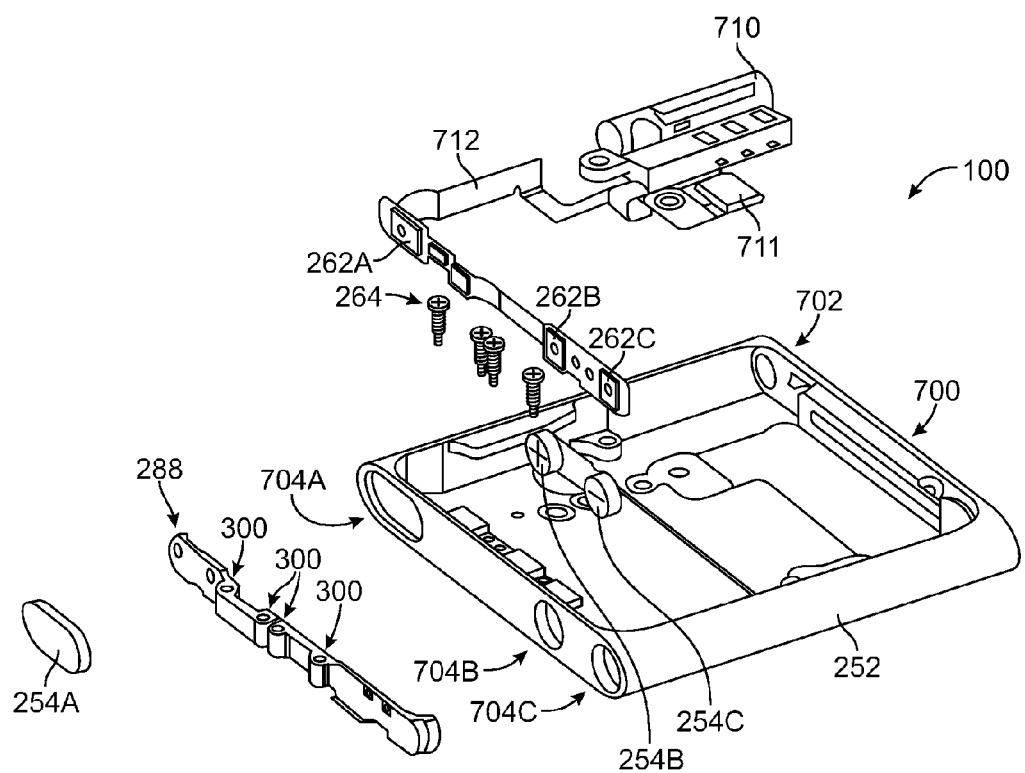
FIG. 10 is an exploded perspective view of an illustrative electronic device housing, a button, and button support structures in accordance with an embodiment of the present invention.

FIG. 10 is an exploded perspective view of buttons such as button 250 of FIGS. 7, 8, and 9 that may be mounted in an electronic device (such as device 100 of FIG. 1). As shown in FIG. 10, device 100 may include three buttons of the type shown in FIGS. 7, 8, and 9. Dome switches 262A, 262B, and 262B for the three buttons may be mounted on a circuit such as flex circuit 712. Flex circuit 712 may be connected to circuitry in device 100. As one example, flex circuit 712 may be connected to circuit 711. Circuit 711 may, if desired, be connected to audio jack connector 710.

Support structure 288 may include four holes 300 with threads. Screws 264 may screw into holes 300 and engage the threads of holes 300.

Device 100 may include openings in device housing 252 such as openings 700, 702, 704A, 704B, and 704C. As examples, opening 700 may be an opening for a 30-pin connector, opening 702 may be an opening for an audio plug, opening 704A may be an opening for button member 254A (e.g., a lock/unlock button), opening 704B may be an opening for button member 254B (e.g., an up button that may be used as a volume up button), and opening 704C may be an opening for button member 254C (e.g., a down button that may be used as a volume down button).

Button members 254A, 254B, and 254C may be respectively biased into openings 704A, 704B, and 704C of device housing 252.

Figure 11:
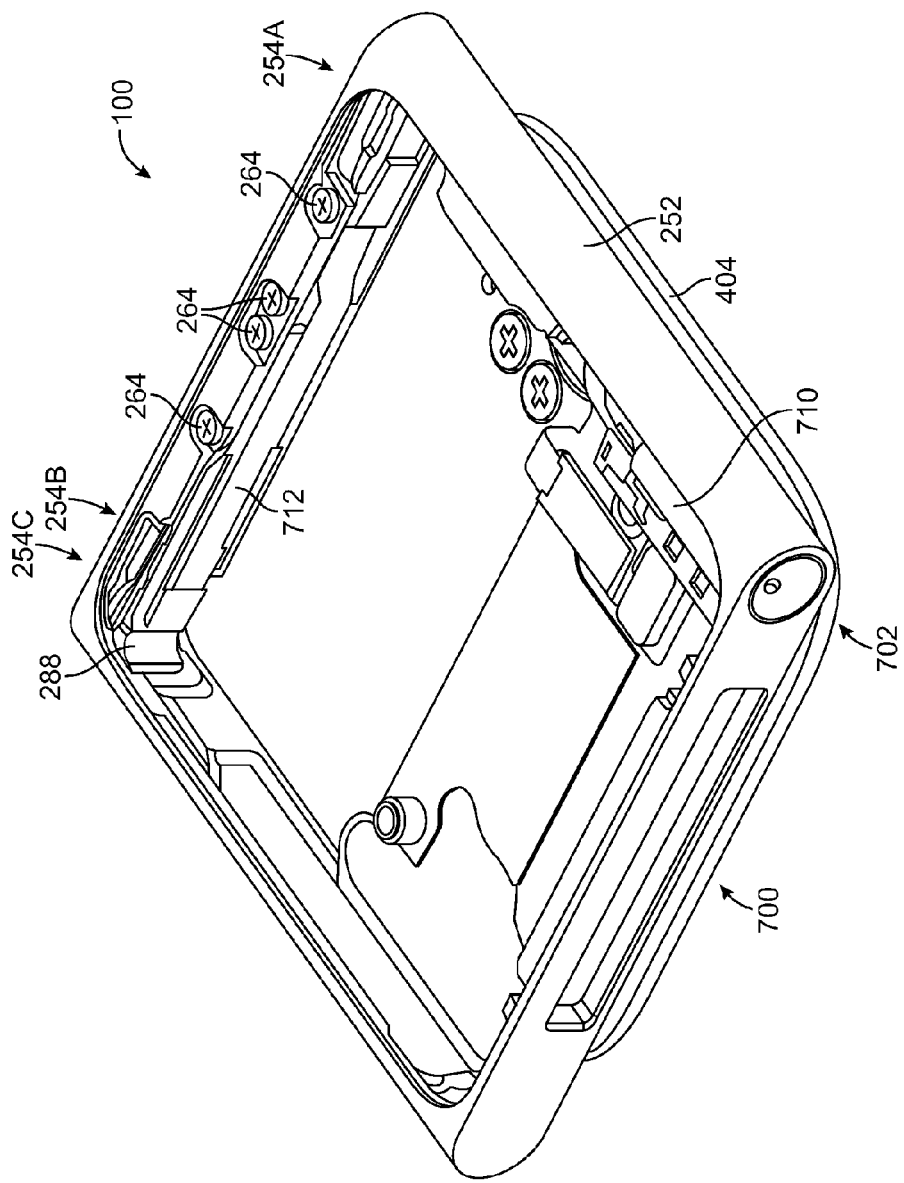
FIG. 11 is a perspective view that shows a button and button support structures such as a button and button support structures of the type shown in FIG. 10 mounted in an electronic device housing such as an electronic device housing of the type shown in FIG. 10 in accordance with an embodiment of the present invention.

A perspective view of the buttons and electronic device of FIG. 10 in an at least partially assembled state is shown in FIG. 11. As shown in FIG. 11, flex circuit 712 may include portions that wrap around support structure 288. If desired, flex circuit 712 may be coupled to support structure 288 (e.g., flex circuit 712 may be coupled to support structure 288 with adhesive).

Electronic devices may be provided with spring-loaded clips. For example, small portable devices such as music player devices may be provided with clips that allow the devices to be attached to articles of clothing.

Figure 12:
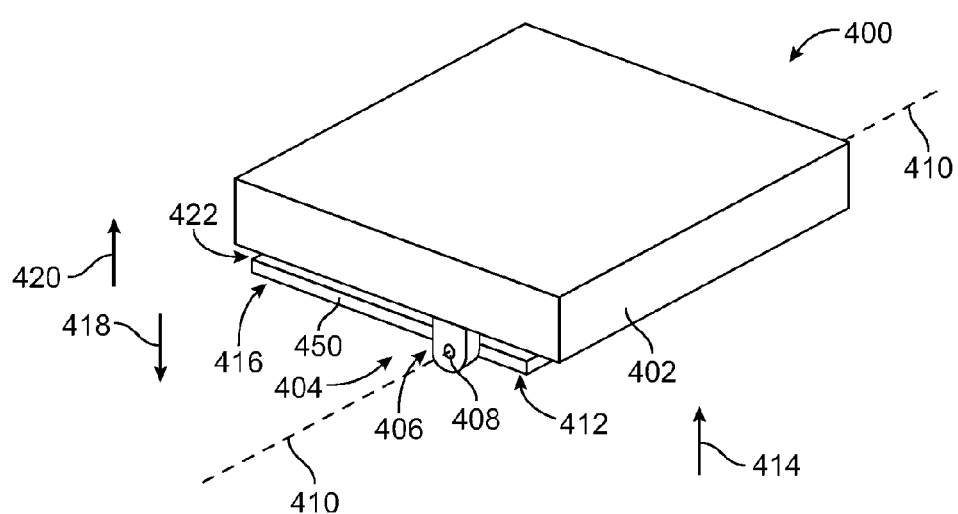
FIG. 12 is a perspective view of an illustrative electronic device that may have a spring-loaded clip and structures in the clip to provide durability in accordance with an embodiment of the present invention.

FIG. 12 is a perspective view of an illustrative electronic device that may be provided with a clip. Electronic device 400 of FIG. 12 may be a media player, a cellular telephone, or other electronic equipment. As shown in FIG. 12, electronic device 40 may have a main body such as housing 402. Housing 402 may be formed from one or more structures such as plastic structures, metal structures, glass structures, composite structures, ceramic structures, or combinations of such structures. Housing 402 may include control circuits, a battery, and user interface components (e.g., buttons, displays such as touch screen displays and non-touch displays, status indicator lights, speaker and microphone ports, audio jacks, input-output port connectors, etc.).

Device 400 may have a clip such as clip 404. Clip 404 may have a clip member such as clip member 450. Hinge 406 and hinge pin 408 may allow clip member 450 to pivot about clip rotational axis 410. When a user presses end 412 of member 450 towards housing 402 in direction 414, end 416 of member 450 is forced away from housing 402 in direction 418. This opens gap 422 to receive an item of clothing or other object. When end 412 is released, a spring in hinge 406 may bias member 450 so that end 416 moves in direction 420 towards housing 402 and grips the item of clothing or other object within gap 422.

Figure 13:
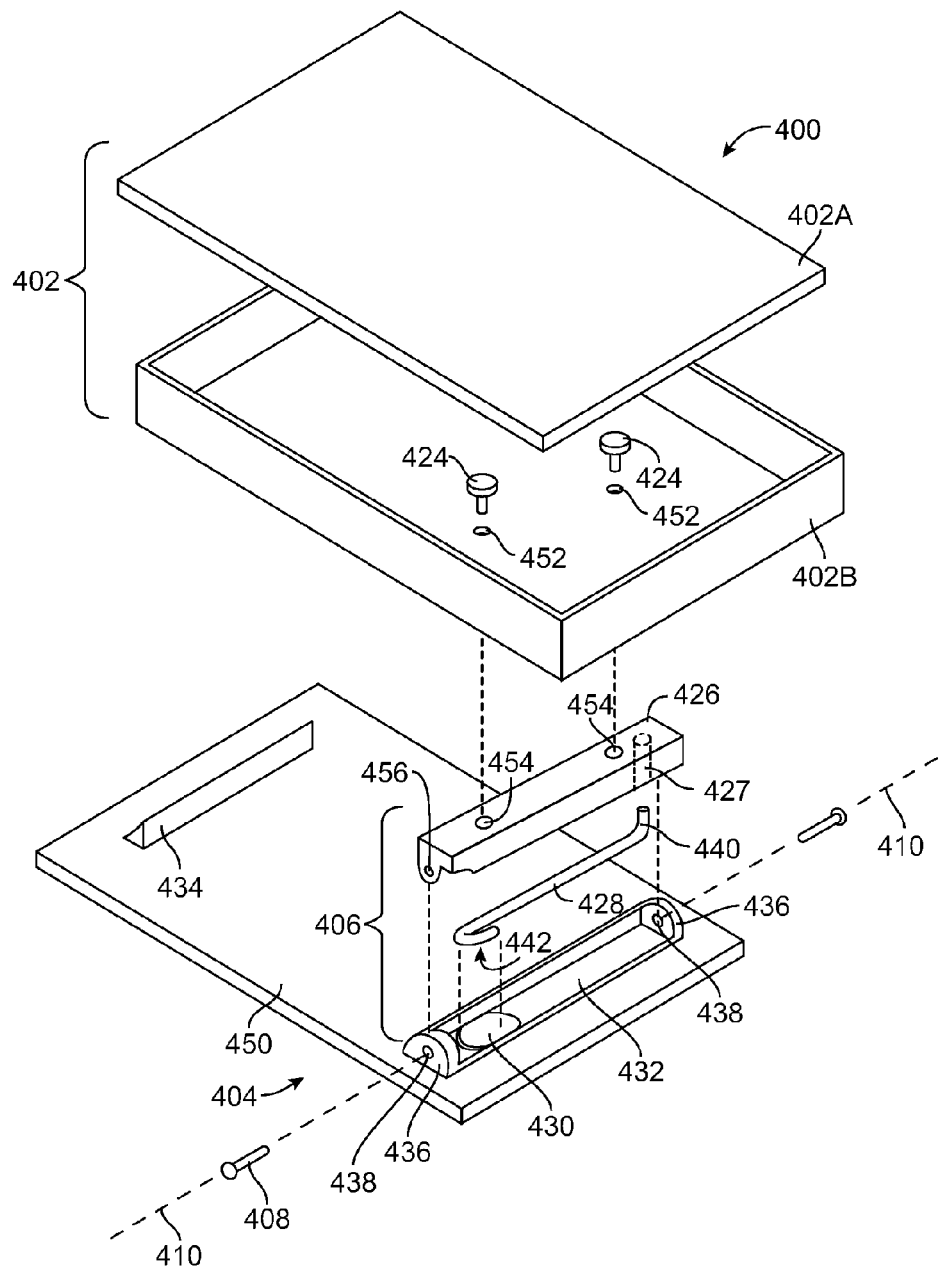
FIG. 13 is an exploded perspective view of an electronic device of the type shown in FIG. 12 in accordance with an embodiment of the present invention.

The spring in hinge 406 may be a torsion spring such as torsion spring 428 in FIG. 13. Spring 428 may be formed from music wire having a diameter of 0.65 mm (as an example). As shown in FIG. 13, housing 402 may include structures 402A and 402B. Structure 402A may be a cover, a display, a control panel, or other structure. Structure 402B may be a lower housing body structure in which printed circuit boards and other components for device 400 are mounted.

Screws 424 may pass through holes 452 in housing 402B and may be received by threaded holes 454 in hinge block structure 426. This attaches hinge block structure 426 to housing 402B.

Member 450 may have a tooth structure such as tooth 434 to help member 450 when grasping items of clothing. Hinge pin support structure 436 may have holes 438 that receive press-fit hinge pins 408 along axis 410. Pins 408 also are received in holes 456 on hinge block structure 426. This holds structure 426 over spring 428 and captures spring 428 between structure 426 and surface 432 of member 450 in hinge structure 436.

Spring 428 may have end portions that engage clip 450 and structure 426. For example, spring 428 may have a bent end such as end 442 that bears against plate 430 on surface 432 of member 450. Spring 428 may also have a bent end such as bent end 440 that engages recess 427 in structure 426. Because structure 426 is attached to housing 402B, end 440 is fixed with respect to housing 402B.

When clip member 450 is rotated around axis 410 to open clip 404, spring 428 twists. The torsion that is produced by the twisted shape of spring 428 produces a restoring force that tends to close clip 404. For this reason, hinge 406 may sometimes be referred to as a torsion hinge or torsion-spring hinge.

Figure 14:
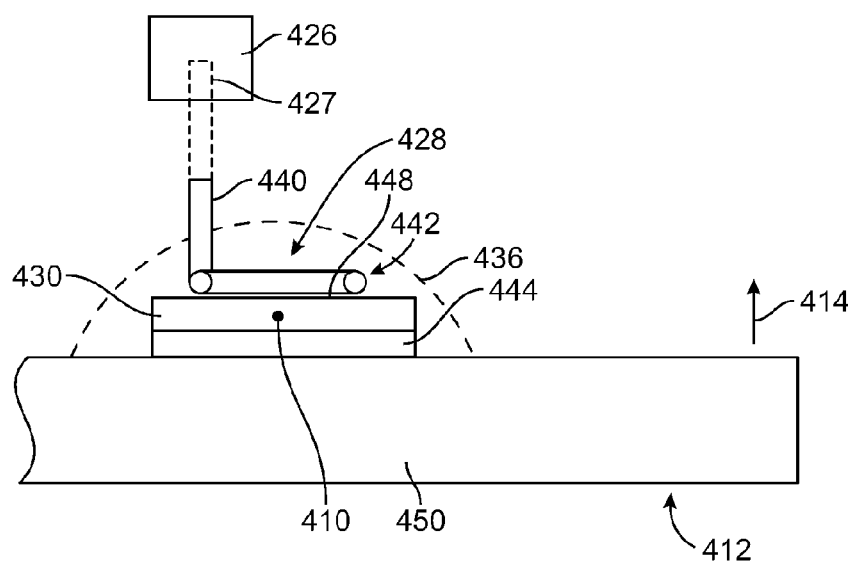
FIG. 14 is a cross-sectional side view of a portion of an electronic device of the type shown in FIGS. 12 and 13 in the vicinity of a spring in accordance with an embodiment of the present invention.

As shown in FIG. 14, plate 430 may be attached to clip member 450 by a layer of adhesive such as adhesive 444. Adhesive 444 may be, for example, a layer of pressure sensitive adhesive that attaches the unexposed underside of plate 430 to member 450. Other attachment mechanisms may be used if desired (e.g., welds, fasteners, slots, etc.).

When end 412 of member 450 is pushed in direction 414 to open clip 404, exposed surface 446 of plate 430 pushes upwards in direction 414 and bears against end 442 of spring 428. End 440 of spring 428 may be received within hole 427 (or other suitable engagement feature) in hinge block structure 426 and is therefore held at a fixed position with respect to housing 402B. As torsion builds in spring 428, the pressure between end 442 and plate 430 increases.

Plate 430 is preferably formed from a durable material that can withstand pressure from end 442 of spring 428 without becoming worn. For example, plate 430 may be formed from a thin sheet of a hard metal such as stainless steel. The metal of plate 430 is preferably harder and more durable than the metal and that forms member 450, thereby enhancing the durability of member 450 and clip 404. In a typical arrangement, member 450 and housing body 402B may be formed from relatively soft materials such as aluminum, other soft metals, or other soft materials such as plastic. By forming plate 430 from a material that is harder than member 450, the surface of member 450 is protected from wear due to contact with end 442 of spring 428. Plate 430 may be formed from stainless steel, tungsten, molybdenum, stiff alloys of materials such as these, or any other material that is harder than member 450.

Figure 15:
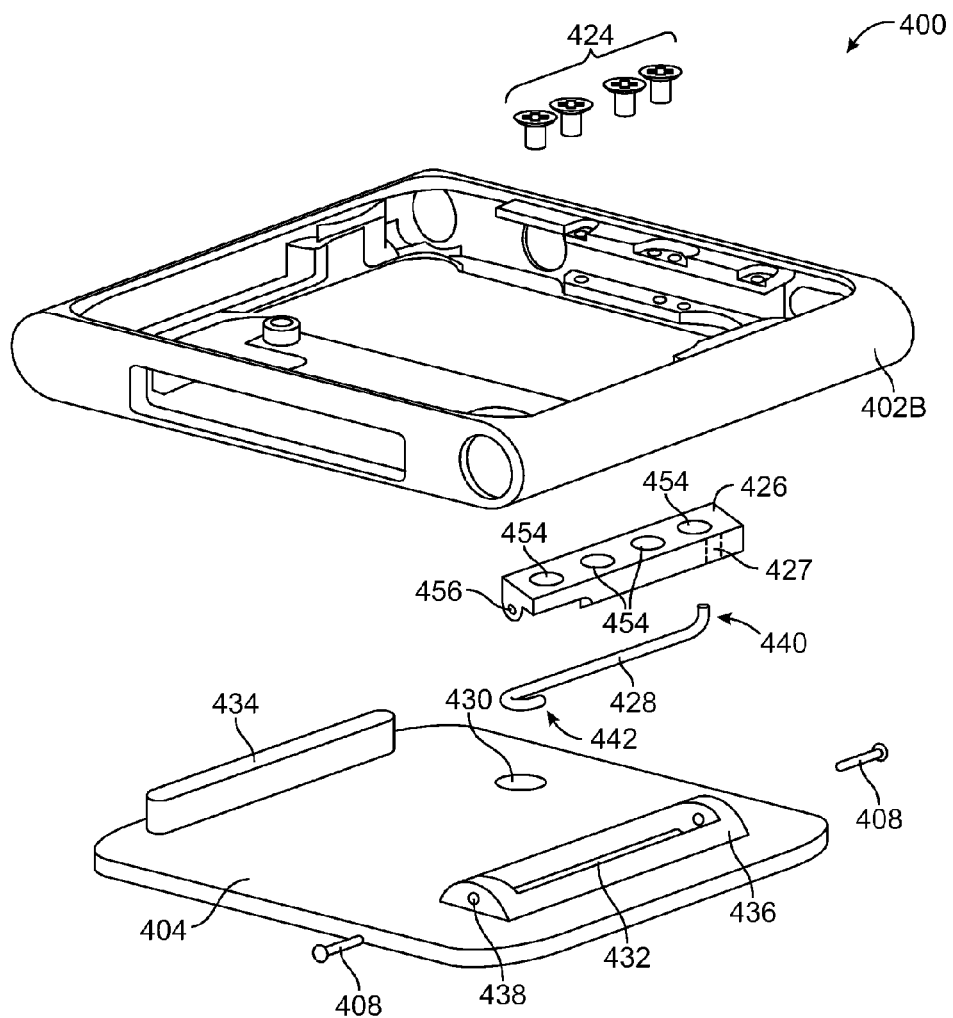
FIG. 15 is an exploded perspective view of an electronic device of the type shown in FIG. 12 in accordance with an embodiment of the present invention.

FIG. 15 is an exploded perspective view of an electronic device such as device 400 of FIG. 12 that may include a clip such as clip 404. As shown in FIG. 15, device 400, housing structure 402B, clip 404, and tooth 434 may have rounded edges. Clip 404 may be mounted to housing structure 402B using four screws 424 (as an example). Housing structure 402B may include four holes 452 (shown in FIG. 25). Screws 424 may pass through holes 452 and thread into holes 454 of hinge block structure 426.

Electronic devices that include displays may have housings with ledges (see, e.g., protrusion 126 of FIG. 2, which forms a ledge that supports lip-shaped cover layer 106). The ledges may be used to support the edges of a display cover layer. It may sometimes be desirable to form gaps within a ledge. For example, it may be desirable to form a gap in a ledge to accommodate a screw or other device component. If care is not taken, the presence of gaps in the ledge may create a failure point that makes the cover layer in the display subject to cracking (i.e., because the display cover layer is not supported by the ledge in the gap region).

Figure 16:
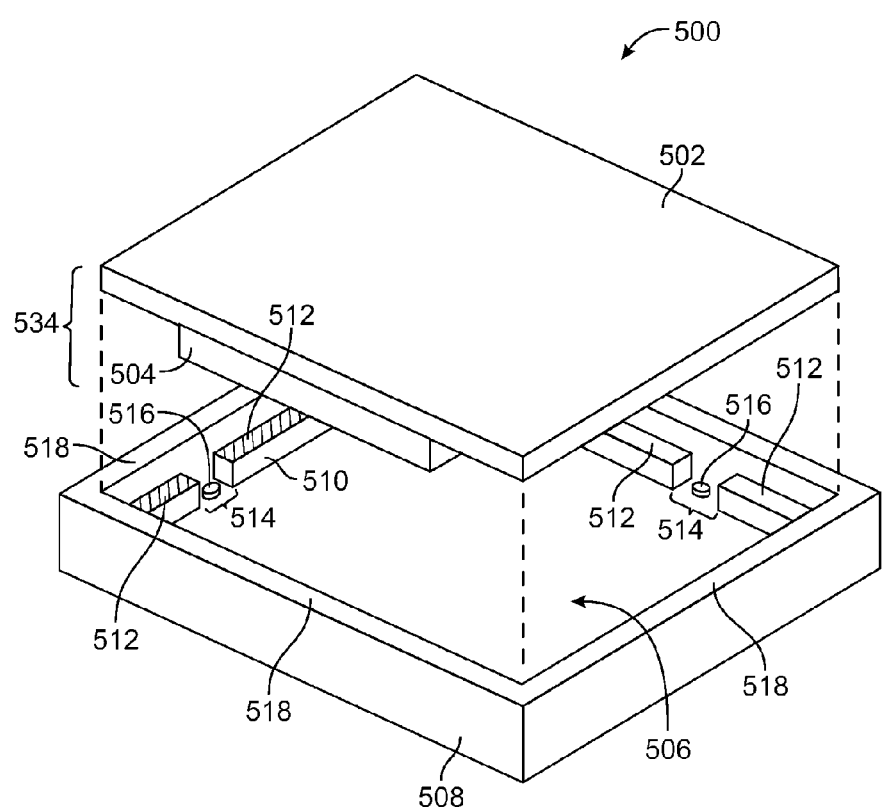
FIG. 16 is an exploded perspective view of an illustrative electronic device that has a display in accordance with an embodiment of the present invention.

This failure mechanism can be at least partly eliminated by providing display support structures. An illustrative device of the type that may be provided with display support structures within housing ledge gaps is shown in FIG. 16. As shown in FIG. 16, electronic device 500 may include a housing such as housing 508. Housing 508 may be formed using a unibody construction or may be formed from one or more separate housing members. Materials that may be used for forming housing 508 include metal, plastic, carbon fiber composites and other composites, ceramics, glass, other materials, and combinations of these materials. In a typical arrangement, housing 508 may be formed from a piece of metal that has been machined to form solid or protrusion-shaped ledges (e.g., ledge structures 510 and associated ledge support surfaces 512).

Device 500 may have a display such as display 534. Display 534 may include a display module such as display module 504. Module 504 may include liquid crystal display (LCD) layers such as color filter and thin-film transistor layers and an optional touch sensor layer. Touch sensor capabilities may be provided using capacitive touch sensors, acoustic touch sensors, piezoelectric touch sensors, resistive touch sensors, or other touch sensors. Display module 504 may be protected by cover layer 502. Cover layer 502 may be formed from a transparent sheet of material such as glass or plastic. Glass structures can provide good scratch resistance and transparency, but can be subject to cracking if device 500 is dropped. Plastic, ceramics, and other transparent cover layer material may also be subject to breakage if device 500 is dropped.

When display 534 is mounted in device 500, the periphery of cover layer 502 rests on ledge surface 512 of ledge 510 and is surrounded by bezel region 518. To ensure that display 534 and cover layer 502 are sufficiently protected against damage, weaknesses in the mounting arrangement for display 534 may be reduced or eliminated. One possible weakness in an arrangement of the type shown in FIG. 16 is the presence of gaps such as gap 514 in ledge structure 510. Gaps such as gaps 514 may be formed to accommodate design constraints (e.g., to make room for screws such as screws 516 or other components). When gaps 514 are present, however, the continuity of ledge surface 512 is disrupted. This creates an unsupported portion along the edge of cover layer 502 that can cause layer 502 to crack if device 500 is dropped or subjected to other impact events.

Figure 17:
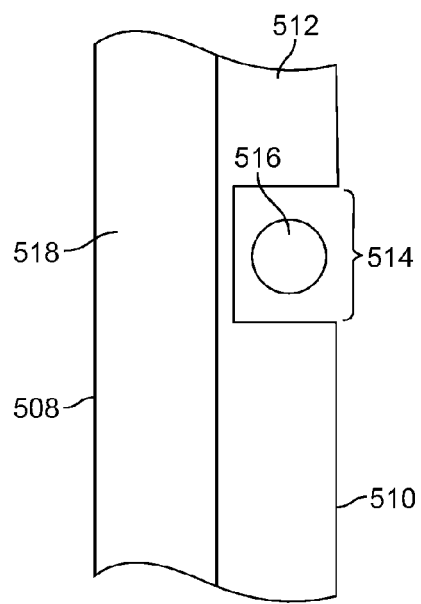
FIG. 17 is a top view of a portion of an electronic device housing showing how the housing may have a ledge on which a cover layer in a display may rest in accordance with an embodiment of the present invention.

FIG. 17 is a top view of ledge 510 showing how incorporation of gap 514 into ledge 510 to accommodate screw 516 results in a discontinuity in ledge surface 512.

Figure 18:
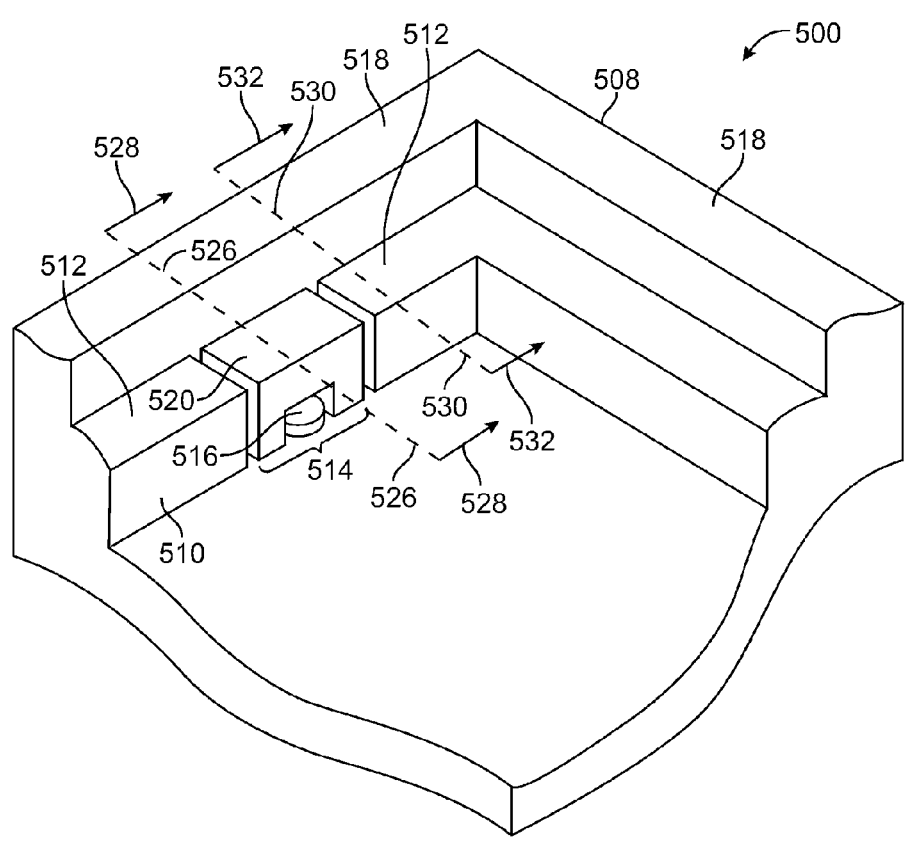
FIG. 18 is a perspective view of an interior portion of an electronic device of the type shown in FIG. 16 showing how a support structure may be used to bridge gaps in a housing ledge in accordance with an embodiment of the present invention.

FIG. 18 shows how device 500 may be provided with support structures such as support structures 520. Structures 520 may have shapes with cavities that accommodate screws 516 or other such components. The size of structures 520 may be configured so that the upper surface of each support structure 520 lies flush with ledge surface 512. Support structures 520 may be attached to housing 508 using pressure sensitive adhesive or other adhesives, fasteners, engagement features, welds, or other suitable attachment mechanisms. Materials that may be used to form support structures 520 include plastic, metal, composites, etc. With one suitable arrangement, housing 508 may be formed from machined metal such as machined aluminum and support structures 520 may be formed from plastic.

Because the upper surface of support structure 520 lies flush with ledge surface 512 of housing ledge portion 510, the ledge surface that supports the periphery of cover layer 502 is substantially continuous. In this respect, support structures 520 serve to help support display cover layer 502 and may therefore sometimes be referred to as display support structures, cover glass support structures, or cover layer support structures.

Figure 19:
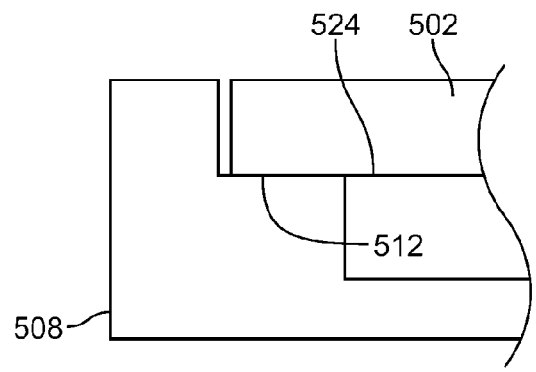
FIG. 19 is a cross-sectional side view of a portion of the housing of FIG. 18 taken through an illustrative portion of a housing ledge that does not have a gap in accordance with an embodiment of the invention.

A cross-sectional view of device 500 of FIG. 18 (including display cover layer 502) that is taken along line 530 of FIG. 18 and that is viewed in direction 532 is shown in FIG. 19. As shown in FIG. 19, in portions of ledge 510 that do not contain gaps, ledge surface 512 supports interior surface 524 of cover layer 502.

Figure 20:
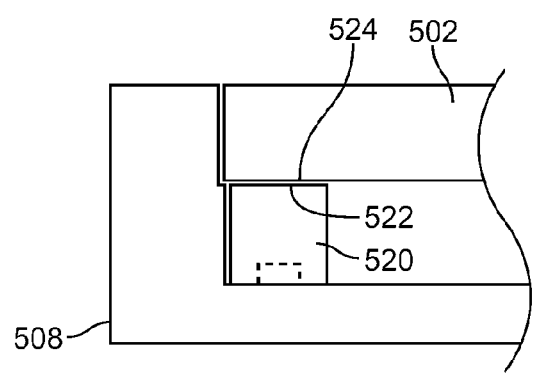
FIG. 20 is a cross-sectional side view of a portion of the housing of FIG. 18 taken through an illustrative portion of a housing ledge that has a gap and an associated display support structure in accordance with an embodiment of the invention.

A cross-sectional view of device 500 of FIG. 18 (including display cover layer 502) that is taken along line 526 of FIG. 18 and that is viewed in direction 528 is shown in FIG. 20. As shown in FIG. 20, in portions of ledge 510 that contain gaps (gaps 514 of FIGS. 16, 17, and 18), ledge surface 512 is substantially reduced or is absent and is therefore unable to support interior surface 524 of cover layer 502. To prevent display cover layer 502 from cracking, support for interior surface 524 of cover layer 502 may be provided by outer ledge surface 522 of support structure 520. Structures 520 are therefore able to bridge gaps in ledge 510 and ensure that display cover layer 502 is satisfactorily supported around its periphery.

Figure 21:
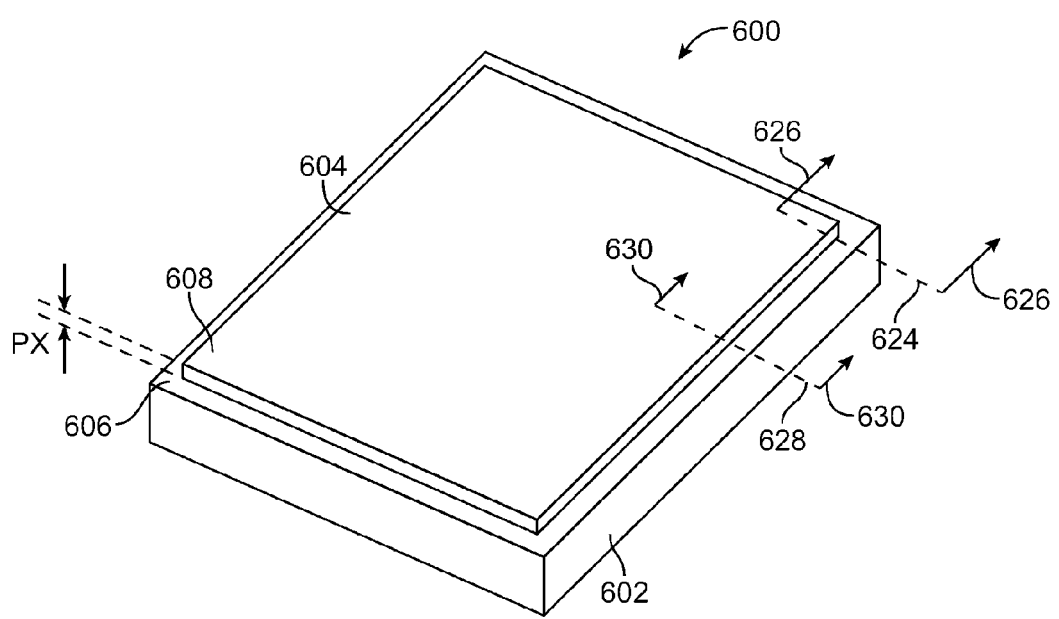
FIG. 21 is a perspective view of an illustrative electronic device that may be provided with a display cover layer in accordance with an embodiment of the present invention.

It may be desirable to provide an electronic device with a display cover layer have a surface that protrudes slightly from the surface of the housing in which the display cover layer is mounted. FIG. 21 is a perspective view of an illustrative electronic device that may be provided with a display of this type. As shown in FIG. 21, device 600 may have a housing such as housing 602. Housing 602 may be formed from plastic, metal, carbon fiber composite material, other composites, glass, ceramics, other materials, or combinations of these materials. Housing 602 may be formed from multiple pieces of material or may be formed using a unibody construction in which housing 602 is substantially formed from a single structure (e.g., machined or cast metal, plastic, etc.).

Display 604 may be mounted to the front face of device 600, so that outer (exterior) surface 608 of display 604 (i.e., the surface of a layer of display cover material such as display cover glass) is located at an elevated distance PX above housing surface 606 (i.e., surfaces 606 and 608 are not flush with each other because surface 608 protrudes outwards past surface 606). Surface 606 may, for example, be associated with a bezel structure that serves as a cosmetic trim for display 604, a metal band such as a housing band or other structure that surrounds display 604, a portion of a unibody housing or multipart housing that surrounds display 604, or other device structures.

The elevation of surface 608 of display 604 above surface 606 of housing 602 may enhance device aesthetics, but may make display 604 more likely to crack when dropped or subjected to other shock events. In a drop event, device 600 may strike the ground front-face down (i.e., with display 604 facing the ground). When device 600 falls, one corner of display 604 may strike the ground before others. This may cause an opposing corner of display 604 to experience a whip-like motion in which the opposing corner of display 604 strikes the ground with a magnified force. Particularly in devices such as device 600 of FIG. 21 that have elevated display surfaces (or other such elevated layers), display 604 may be prone to damage if not designed properly.

Figure 22:
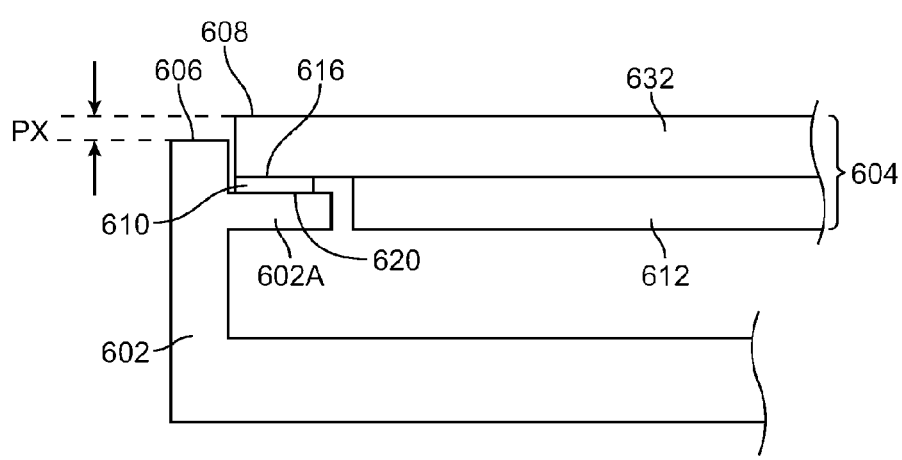
FIG. 22 is a cross-sectional side view of an illustrative electronic device of the type shown in FIG. 21 taken along a central portion of a display edge in accordance with an embodiment of the present invention.
Figure 23:
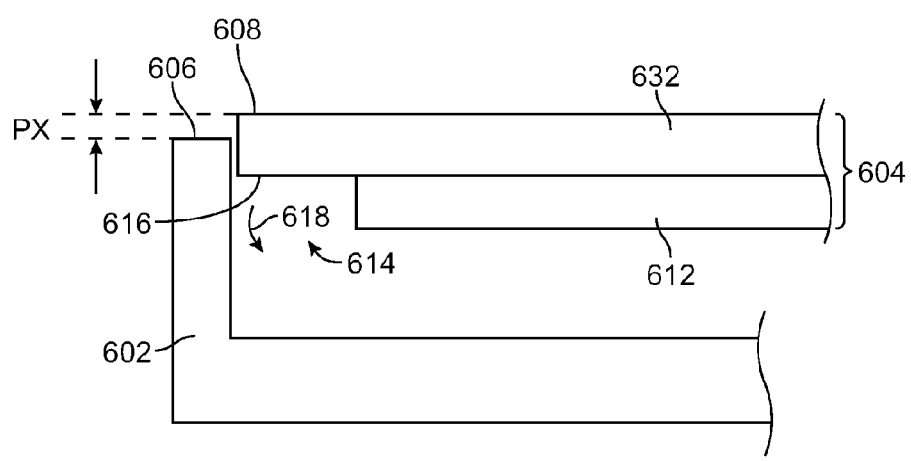
FIG. 23 is a cross-sectional side view of an illustrative electronic device of the type shown in FIG. 21 taken at a corner portion of a display edge in accordance with an embodiment of the present invention.

To prevent damage during drop events, device 600 may have display mounting ledges that run along only portions of the periphery of device 600. Near the corners of device 600 in which display 604 may be subject to a whip-like strike, the display mounting ledges may be absent to accommodate potential flexing of display 604 (i.e., flexing in a display cover layer such as a display cover glass layer). This type of arrangement is illustrated in more detail in FIGS. 22 and 23. FIG. 22 is a cross-sectional view of the right-hand edge of device 600 of FIG. 21 taken along line 628 of FIG. 21 and viewed in direction 630. FIG. 23 is a cross-sectional view of the right-hand edge of device 600 of FIG. 21 taken along line 624 and viewed in direction 626.

The cross-sectional view of FIG. 22 corresponds to a portion of device 600 in which a display mounting ledge is present and is used to mount display 604. As shown in FIG. 22, display 604 may include cover layer 632 and display module structures 612. Display module 612 may include layers that form an image pixel array for displaying images for a user of device 600. If desired, display module layers 612 may include a touch sensor array based on capacitive sensors, resistive sensors, acoustic sensors, piezoelectric sensors, or other sensors. The layers of display module 612 may also include a backlight, polarizers, a color filter layer, a liquid crystal layer, a thin-film transistor layer, and other display layers. Display module 612 may be an organic light-emitting diode (OLED) display module, a plasma display module, a display module using liquid crystal display (LCD) technology, or other suitable display.

As shown in FIG. 22, the exposed outer surface of display 604 may be covered with a transparent protective member such as planar transparent cover layer 632. Layer 632 may be formed from plastic, glass, ceramic, or other transparent substances. In a typical scenario, layer 632 may be formed from glass. Layer 632 may therefore sometimes be referred to as a cover glass layer. As with the other electronic device arrangements described herein, the use of glass to form protective cover layer 632 is merely illustrative. Other materials may be used in protective layer 632 if desired.

FIG. 22 shows how the edge of cover layer 632 may have a lower edge surface such as surface 616 that is mounted on a ledge in housing 602 such as ledge surface 620. A layer of adhesive such as pressure sensitive adhesive 610 may be interposed between lower cover layer surface 616 and upper surface 620 of the housing ledge. The housing ledge may be formed from a portion of housing 602 such as protrusion 602A or other suitable housing structures. Module 612 may have a smaller planar area than cover layer 632 (i.e., a smaller footprint when viewed from the front face of device 600), so that the edges of module 612 are somewhat recessed from the edges of cover layer 632. Strips of adhesive such as pressure sensitive adhesive 610 may run along each of the four peripheral edges of display 604.

Protrusion 602A and display mounting ledge surface 620 are preferably absent from the four corners of device 600, as shown in the cross-sectional view of FIG. 23. As shown in FIG. 23, the inner surfaces of housing 602 in the corners of housing 602 are configured to form a cavity (opening 614) under each lower edge surface 616 of display cover layer 632.

Ledge-shaped protrusion 602A and ledge surface 620 of FIG. 22 (which are present along the center of the edges of the display) are not present at the corners of display 604 and device 600. As a result of the absence of support from an underlying ledge, cover layer 632 is free to flex somewhat in the event that cover layer 632 experiences an inward force during a drop event. If, for example, exposed surface 608 of cover layer 632 experiences an inward force because of a drop event, the corner of cover layer 632 and the associated lower surface 616 in the corner of display 604 can flex inward in direction 618 without being impeded by protrusion 602. Cover layer 632 is then able to rebound without cracking after the drop event is over.

Figure 24:
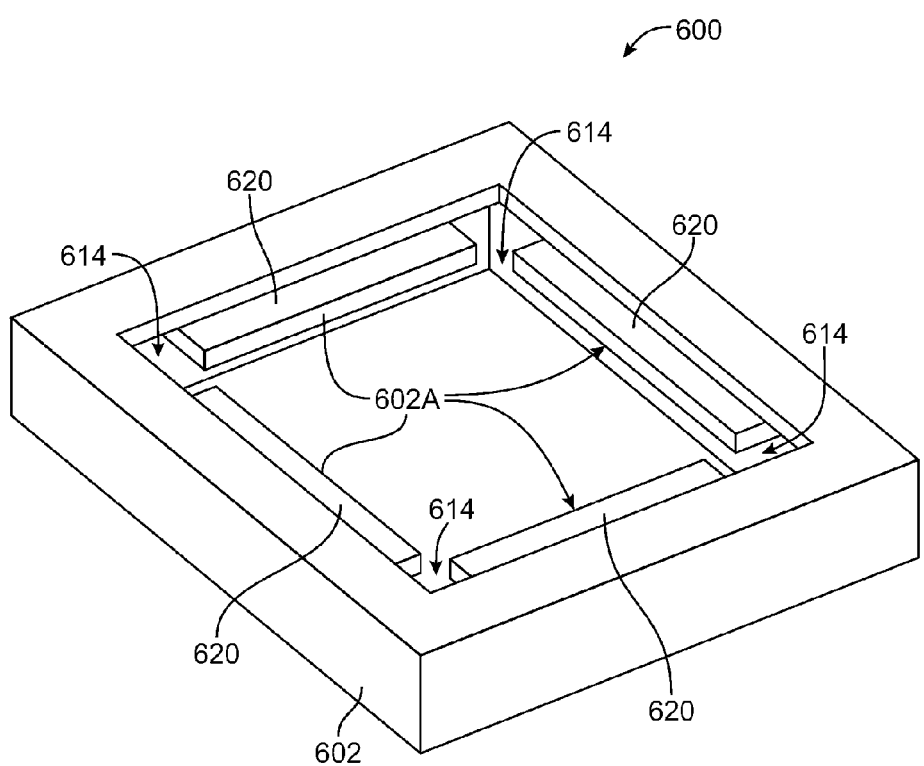
FIG. 24 is a perspective view of a housing for an electronic device of the type shown in FIG. 21 showing how corner portions may be removed from a housing ledge on which the edges of a display cover layer are mounted in accordance with an embodiment of the present invention.

The amount of each corner that is free of ledge surface 620 and protrusion 602A can be, for example, 1-30% of the length of each edge, 5-10% of the length of each edge, less than 25% of the length of each edge, or other suitable amount of the edge length in device 600. FIG. 24 shows an illustrative arrangement that may be used for device 600. As shown in FIG. 1, housing structures such as protrusions 602A or other portions of housing 602 may serve as ledges that form ledge surfaces 620. Each ledge surface may run along a respective edge of housing 602. If desired, surface 620 on each edge may be interrupted by one or more gaps that are filled with support structures as described in connection with support structures 520 of FIG. 18. Corner openings (cavities) 614 may be formed at each corner of device 600, so that each of the four corners of display cover layer 632 are unsupported (as shown in FIG. 23) and do not rest on protrusion 602A of FIG. 22.

Figure 25:
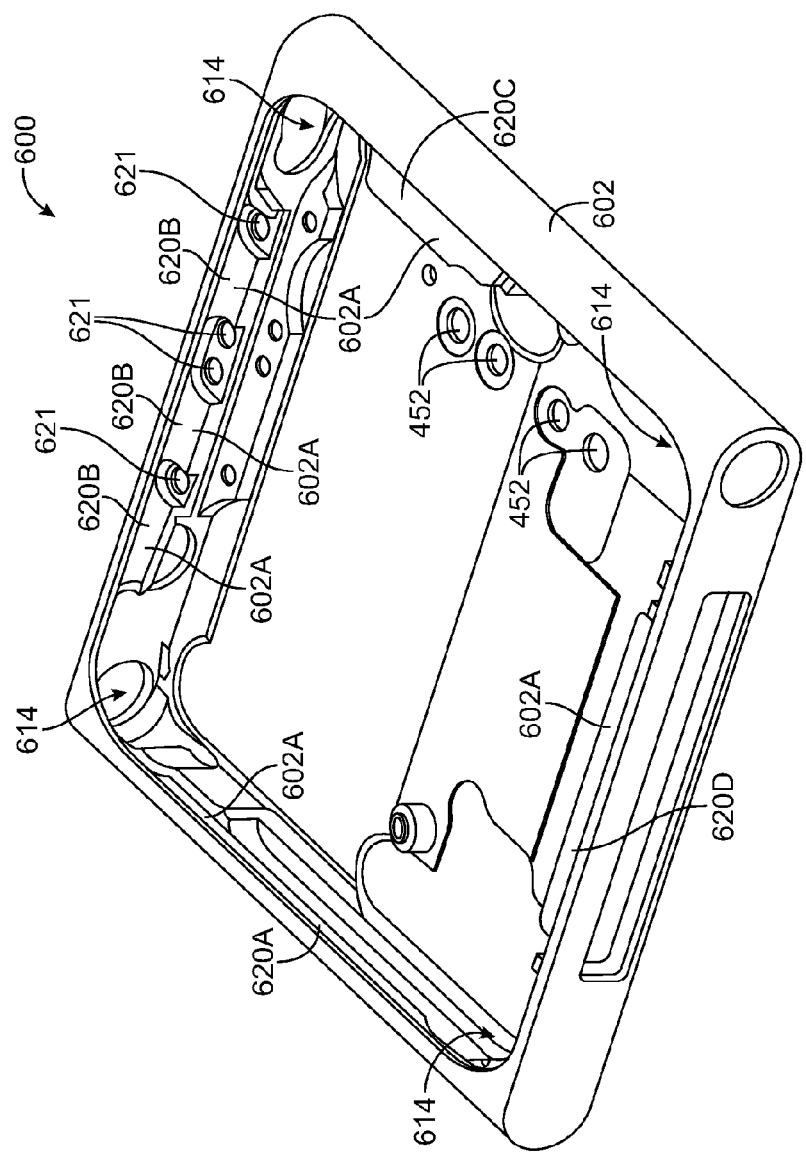
FIG. 25 is a perspective view of a housing for an electronic device of the type shown in FIG. 21 showing how corner portions may be removed from a housing ledge on which the edges of a display cover layer are mounted in accordance with an embodiment of the present invention.

FIG. 25 is a perspective view of an electronic device such as device 600 of FIG. 21 that may include display mounting ledges that run along only portions of the periphery of device 600. FIG. 25 shows an illustrative arrangement in which housing structures such as protrusions 602A or other portions of housing 602 serve as ledges that form ledge surfaces 620. In the FIG. 25 example, ledge surface 620A is relatively narrow (e.g., surface 620A may be narrower than ledge surfaces 620B, 620C, and 620D), ledge surface 620B is formed in multiple sections (e.g., to allow passage of screws into openings 621), ledge surface 602C is formed along a relatively short length of the edge of housing 602 (e.g., surface 602C may be shorter in overall length that ledge surfaces 620A, 620B, and 620D), and ledge surface 620D may be formed adjacent to opening 620D (e.g., a 30-pin opening).

It may be desirable to use adhesion promotion materials to help securely mount flex circuit structures such as the cable formed from flex circuit 114 of FIG. 3 to support structures such as support structure 138. To ensure adequate adhesion between flex circuit 114 and support structure 138, a patterned coating of an adhesion promotion material may be formed on the flex circuit.

Figure 26:
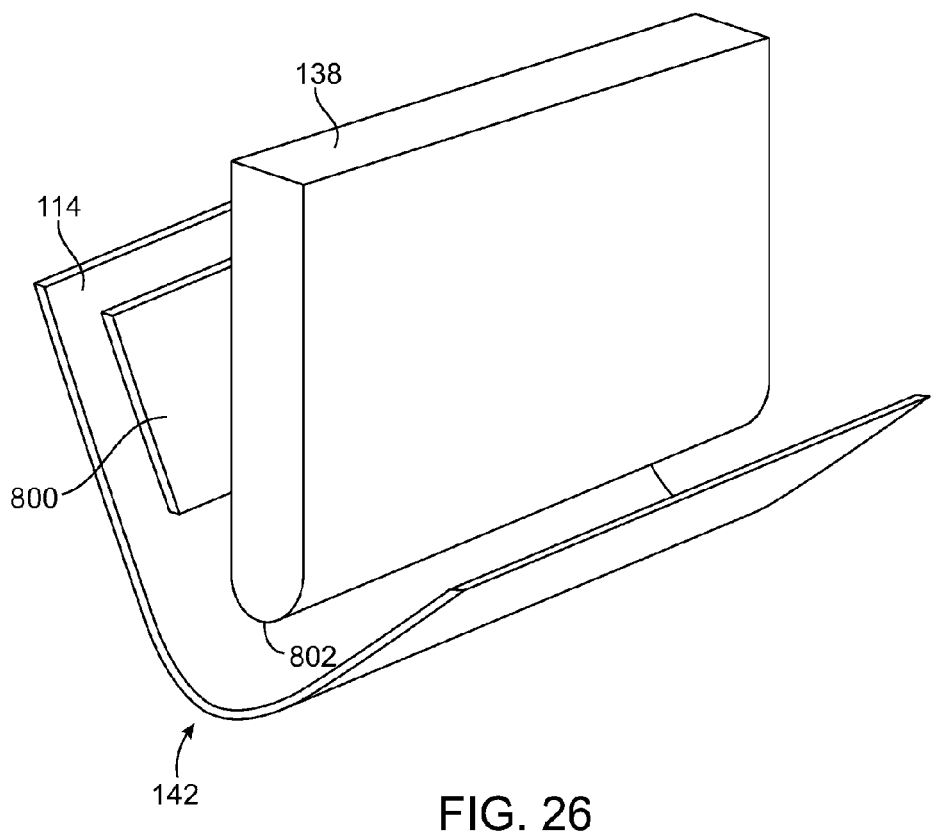
FIG. 26 is a perspective view of an illustrative spacer and flex circuit in accordance with an embodiment of the present invention.

FIG. 26 is an exploded perspective view of an illustrative support structure (sometimes referred to as a spacer) and associated flex circuit with an adhesion promotion layer. As shown in FIG. 26, support structure 138 may have curved surface 802. Surface 802 may help define a known and acceptable bend radius for bend 142 in flex circuit 114. Support structure 138 may be formed from a material that is transparent to light such as clear polycarbonate, other clear plastics, glass, etc. Support structure 138 may, for example, be formed from optically clear polycarbonate that is transparent at ultraviolet (UV) wavelengths. The use of a UV-transparent material for support structure 138 may help distribute ultraviolet light that can be used in curing adhesive (e.g., UV-cured epoxy or other UV adhesive).

Flex circuit 114 may be formed from one or more sheets of flexible dielectric such as one or more sheets of polyimide or other polymer layers. Patterned conductive lines such as traces of copper or other metal may be incorporated into the layers of flex circuit 114 to form signal pathways for signals in device 100. The patterned lines in flex circuit 114 may be used to form a serial bus, a parallel bus, radio-frequency transmission lines, paths for control signals, paths for display data, and other electrical paths.

Adhesives such as thermally cured adhesives and light-cured adhesives (e.g., UV adhesives) may be used in attaching flex circuit 114 to support structure 138. The process of thermally bonding a structure to flex circuit 114 may involve elevated temperatures. For example, thermal-bonding adhesives may form durable bonds when elevated to temperatures of about 150° C. (e.g., 100° C. or more, 150° C. or more, 100-200° C., etc.). At the same time, some structures in device 100 (e.g., display structures associated with display 104) may be sensitive to elevated temperatures. As an example, display 104 may have a light reflector layer that is subject to warping if elevated to temperatures above 70° C.

The use of elevated adhesive curing temperatures may be avoided in some situations by using UV adhesive. UV adhesive can be cured by application of UV light without involving the application of heat. Nevertheless, it may be difficult or impossible to achieve desired adhesion strengths when using UV adhesive to bond structures directly to flex circuit 114, due to the inherently weak nature of UV-adhesive-to-polyimide bonding.

To address this potential bonding weakness and thereby ensure that flex circuit 114 is well attached to support structure 138, a layer of adhesion promotion material such as material 800 may be interposed between flex circuit 114 and an adhesive that helps bond flex circuit 114 to the surface of support structure 138. By using a coating of material 800, adhesion may be increased sufficiently that UV adhesive can be used to attach flex circuit 114 to support structure 138, avoiding the need to use potentially damaging elevated temperatures. Adhesion promotion material 800 may be formed from a substance such as ink (e.g., a coating of black ink such as Taiyo® SW400 black ink having a thickness of less than 0.5 mm or less than 0.1 mm or other suitable thicknesses).

The application of ink 800 to flex circuit 114 can increase the brittleness of flex circuit 114. It may therefore be desirable to limit the application of ink 800 to portions of flex circuit 114 that are away from bend region 142, where flex circuit 114 is flexed during assembly. As shown in the cross-sectional view of FIG. 27, for example, ink 800 can be patterned so as to cover only region 810 along the side of support structure 138, not end region 812 of structure 138 in the vicinity of bend 142.

Figure 27:
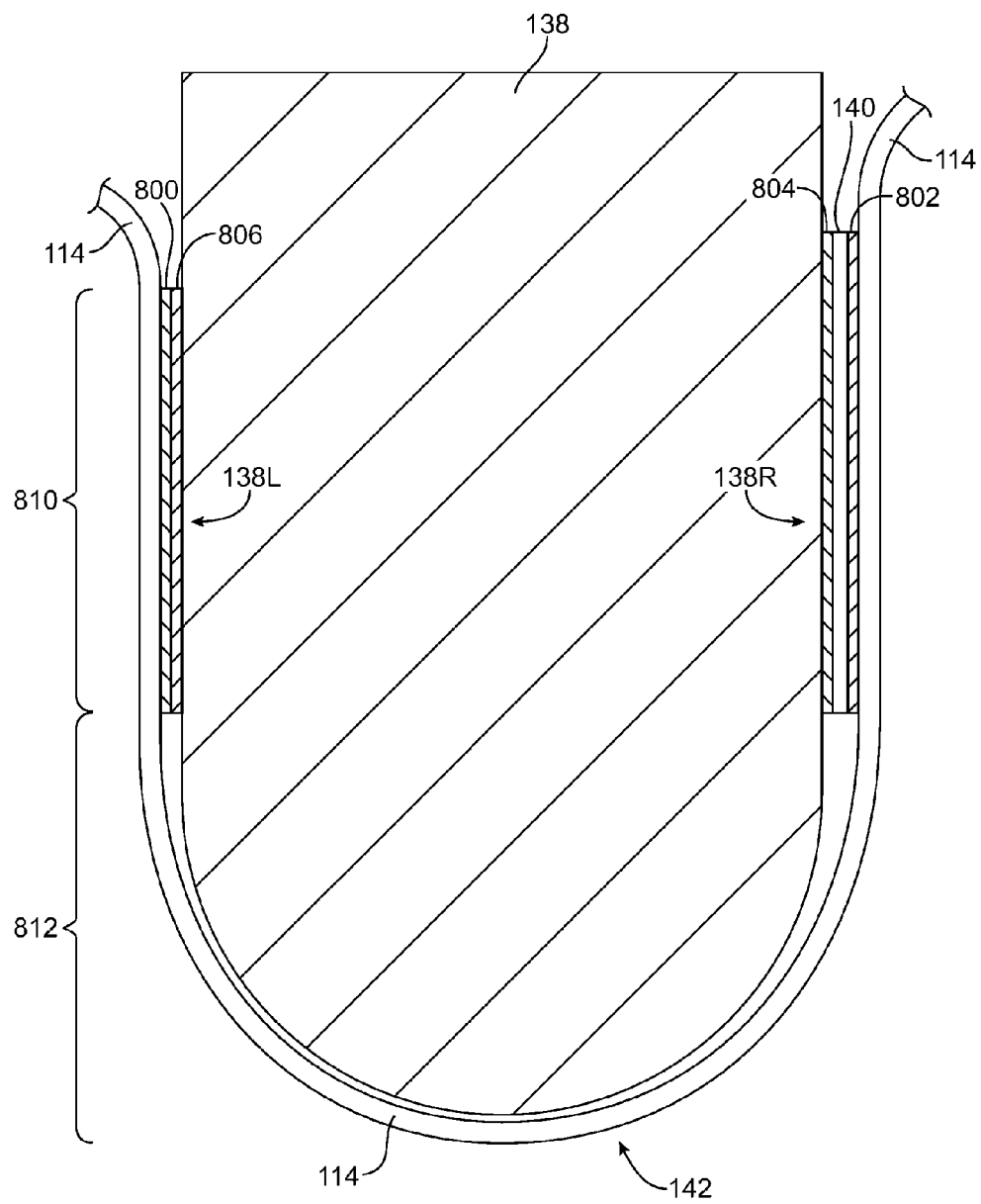
FIG. 27 is a cross-sectional end view of an illustrative spacer to which a flex circuit has been attached in accordance with an embodiment of the present invention.

After ink layer 800 has been formed, an adhesive such as UV adhesive may be used to attach flex circuit 114 to support structure 138. As shown in FIG. 27, for example, adhesive 806 may be used to attach ink 800 and flex circuit 112 to side 138L of support structure 138. The same type of bonding approach may be used to attach flex circuit 114 to side 138R of support structure 138 or, as shown in FIG. 27, stiffener 140 may be attached to flex circuit 114 using thermally cured adhesive 802 (e.g., adhesive that forms a bond upon application of an elevated temperature). With this type of approach, adhesive 802 may form a strong bond between stiffener 140 and flex circuit 114. Stiffener 140 may be formed from a material such as stainless steel, plastic, glass, or other materials that exhibit satisfactory adhesion to UV adhesive. This allows stiffener 140 may be attached to surface 138R of support structure 138 using adhesive 804 such as UV adhesive. Because adhesive layers such as adhesive layer 806 on surface 138L and adhesive layer 804 on surface 138R of support structure 138 can be formed using UV adhesive, it is not necessary to subject support structure 138 or the other structures in device 100 (e.g., display structure 104) to elevated temperatures when attaching flex circuit 114 to support structure 138 in device 100.

FIGS. 28, 29, 30, and 31 show equipment and processes that may be used in attaching flex circuit 114 to support structure 138.

Figure 28:
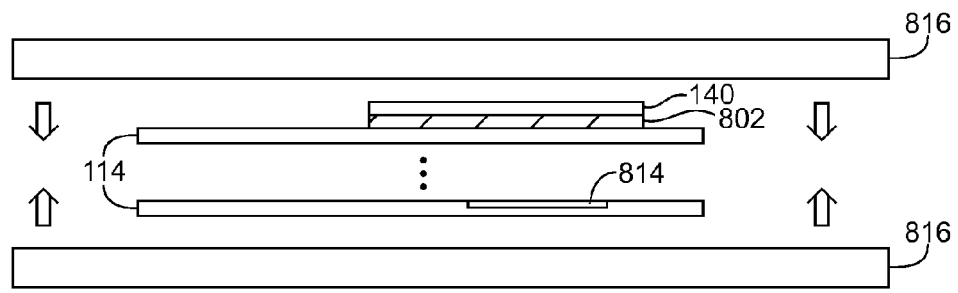
FIG. 28 is a side view showing how layers of flex circuit material may be bonded together to form a flex circuit and showing how a stiffener may be thermally bonded to the flex circuit using a heated press in accordance with an embodiment of the present invention.

To form desired electrical pathways in flex circuit 114, one or more layers of flex circuit 114 may be provided with patterned traces such as traces 814 of FIG. 28. Flex circuit 114 may be formed from one or more layers of polyimide or other polymers (as examples). Stiffener 140 may be attached to the uppermost layer of flex circuit 114 using thermally curing adhesive 802. The layers of flex circuit 114 may be bonded together (e.g., using adhesive) while stiffener 140 is attached to the uppermost layer of flex circuit 114 by application of heat and pressure. For example, heated plates 816 of a heated press may be moved towards each other to compress and bond together stiffener 140, thermal adhesive 802, and the individual layers of flex circuit 114. Heated plates 816 may raise the temperature of adhesive 802 to a temperature of about 100° C., to about 150° C., or to other temperatures sufficient for curing thermal adhesive 802.

Figure 29:
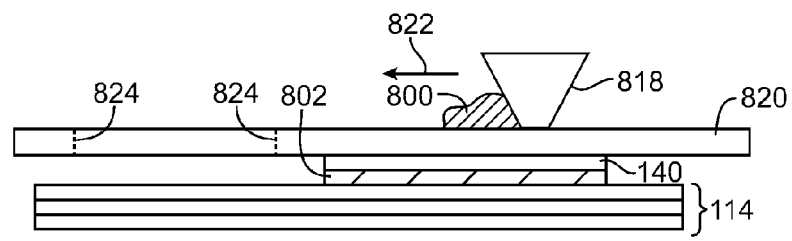
FIG. 29 is a side view of a screen printing tool of the type that may be used in forming a patterned adhesion promotion layer such as a patterned coating of ink on the surface of a flex circuit in accordance with the present invention.

After flex circuit 114 and bonded stiffener 114 are removed from the heated press, a patterned layer of ink or other adhesion-promotion layer may be formed on flex circuit 114. As shown in FIG. 29, for example, squeegee 818 may be moved in direction 822 to force ink 800 through patterned openings such as opening 824 in screen 820. This deposits ink 800 in a pattern (e.g., a rectangular shape of the type shown in FIG. 26) on the upper surface of flex circuit 114.

Figure 30:
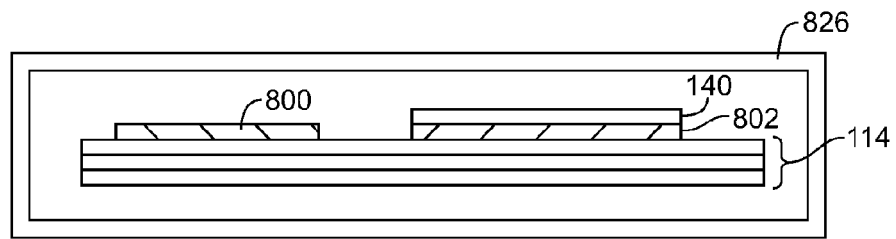
FIG. 30 is a side view of an oven that is being used to heat a flex circuit with a patterned adhesion promotion layer of the type that may be formed using the equipment of FIG. 29 in accordance with an embodiment of the present invention.

An oven or other heating tool may then be used to heat and dry layer 800, so that layer 800 forms a satisfactory bond to flex circuit 114 (see, e.g., oven 826 of FIG. 30).

Figure 31:
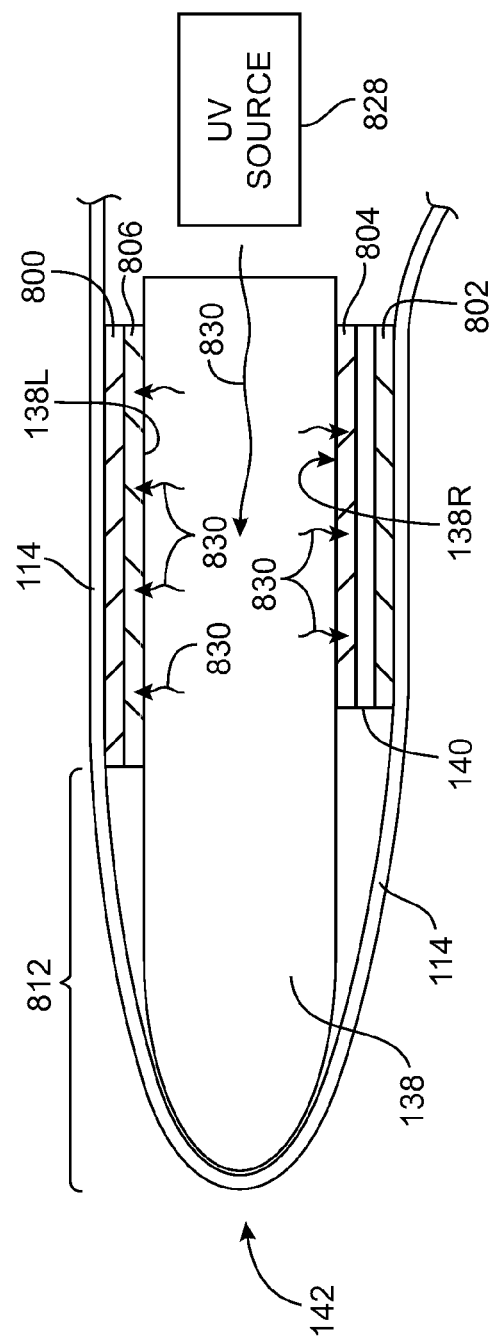
FIG. 31 is a side view of an illustrative spacer to which a flex circuit is being attached using ultraviolet-light-cured adhesive that is being launched into the interior of the spacer in accordance with an embodiment of the present invention.

Once patterned ink layer 800 has been formed on flex circuit 114, flex circuit 114 may be attached to support structure 138 using layers of adhesive such as UV adhesive layer 806 and UV adhesive layer 804 of FIG. 31. Light source 828 (e.g., a UV light source such as a UV lamp) may be used to introduce UV light 830 into the interior of support structure 138. Support structure 138 may be formed from a material with sufficient transparency to allow a substantial fraction of the light that has been launched into support structure 138 to pass into UV adhesive layers 804 and 806. As light 830 illuminates layers 804 and 806, the adhesive of layers 804 and 806 is cured. Using this approach, adhesive 806 can attach ink 800 and flex circuit 114 to surface 138L of support structure 138. Adhesive 804 can attach stiffener 140 and flex circuit 114 to surface 138R of support structure 138. Tip region 812 at the end of support structure 138 near bend 142 may be ink free to help avoid making flex circuit 114 undesirably brittle where flex circuit 114 is being flexed to bend around support structure 138.

Figure 32:
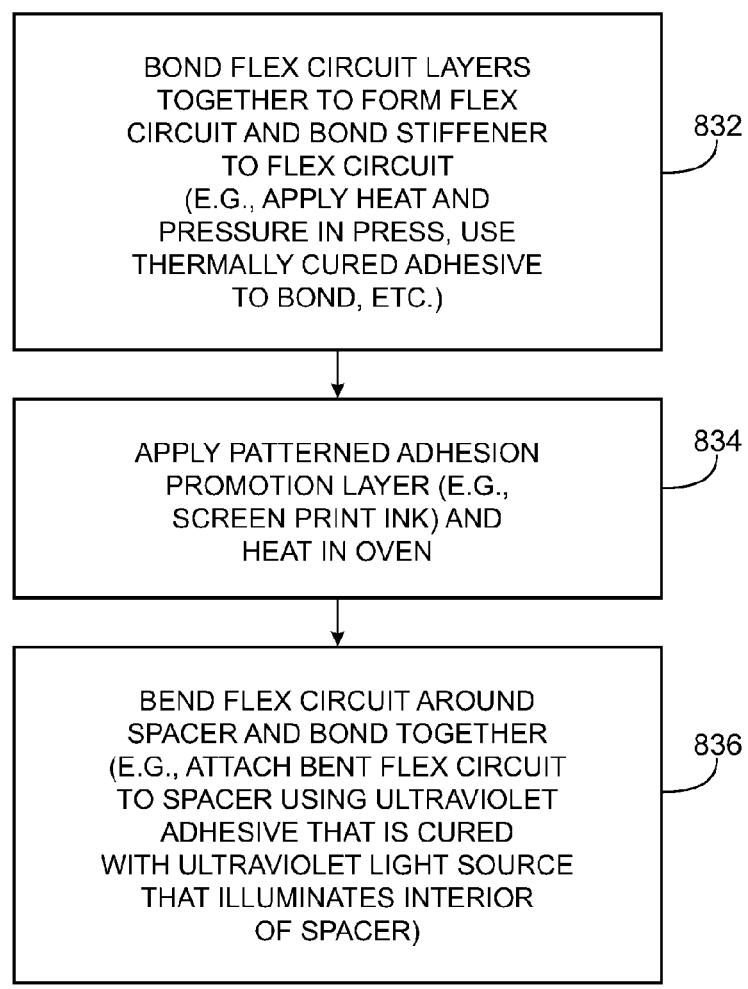
FIG. 32 is a flow chart of illustrative steps involved in attaching a flex circuit to a support structure in accordance with an embodiment of the present invention.

Illustrative steps involved in using equipment of the type shown in FIGS. 28, 29, 30, and 31 to attach a flexible structure such as flex circuit 114 to a support structure such as support structure 138 are shown in FIG. 32.

At step 832, layers of polyimide or other sheets of flexible material that contain patterned conductive traces may be bonded together (e.g., using a tool such as a press with plates 816 of FIG. 28). Stiffener 140 may be thermally bonded to flex circuit 114 by heating plates 816 to an elevated temperature (e.g., above 70° C., about 150° C., etc.).

At step 834, patterned ink layer 800 may be formed on flex circuit 114. Patterned ink 800 may be formed by screen printing, pad printing, brush application, spraying, dripping, inkjet printing, etc. An oven such as oven 826 may be used to bake ink 800 to flex circuit 114.

To complete the assembly of support structure 138 and flex circuit 114 into device 100 (as shown, for example, in FIG. 3), UV-curable liquid adhesive layers 804 and 806 may be formed on support structure 138 and flex circuit 114 may be wrapped around end 142 of support structure 138 (step 836). Some or all of the wrapping operations involved in bending flex circuit 114 around end 142 of support structure 138 may occur after support structure 138 has been mounted within the housing of device 100. For example, flex circuit 114 may be wrapped around support structure 138 when assembling components within the housing of device 100 such as components that are attached to the ends of flex circuit 114 (e.g., a display, display driver circuits, logic boards, etc.).

During the operations of step 836, adhesive layers 804 and 806 may be cured by exposure to UV light 830 from UV light source 828 (e.g., after flex circuit 114 and support structure 138 have been placed within device 110). No elevated temperatures are needed to UV cure layers 804 and 806, so flex circuit 114 may be attached to support structure 138 without elevating the temperature of device 100 and potentially fragile structures such as display 104.

The foregoing is merely illustrative of the principles of this invention and various modifications can be made by those skilled in the art without departing from the scope and spirit of the invention. The foregoing embodiments may be implemented individually or in any combination.

What is claimed is:

1. An electronic device, comprising:
   a display having a cover layer, a thin-film transistor layer, and a plurality of additional layers, wherein the thin-film transistor layer is physically coupled to the cover layer through the plurality of additional layers in the display;
   a housing having a protrusion that is interposed between the cover layer and the thin-film transistor layer, wherein the housing comprises a rear housing surface, wherein the thin-film transistor layer is interposed between the cover layer and the rear housing surface, and wherein the housing and the protrusion are formed from one piece; and
   an electronic component coupled to the display, wherein the protrusion extends over a cavity in the housing and wherein the electronic component is located within the cavity.

2. The electronic device defined in claim 1 wherein the housing comprises peripheral regions adjacent to a side of the cover layer, the electronic device further comprising adhesive joining the protrusion of the housing and the cover layer together.

3. The electronic device defined in claim 1 wherein the cover layer is located on a first side of the housing protrusion and wherein the display comprises display components located on a second side of the housing protrusion.

4. The electronic device defined in claim 1 wherein the display comprises display components and wherein the housing protrusion defines a cavity within which at least some portion of the display components are disposed.

5. The electronic device defined in claim 1 wherein there is at least one direct line between the cover layer and the thin-film transistor layer that does not include any air gaps.

6. An electronic device, comprising:
   a display having a cover layer and a thin-film transistor layer;
   a housing having a protrusion that is interposed between the cover layer and the thin-film transistor layer, wherein the housing comprises a rear housing surface, wherein the thin-film transistor layer is interposed between the cover layer and the rear housing surface, and wherein the housing and the protrusion are formed from one piece;
   a flex circuit that has an end that is attached to the thin-film transistor layer, wherein the protrusion is interposed between the end of the flex circuit and the cover layer; and
   an electronic component coupled to the display, wherein the protrusion extends over a cavity in the housing and wherein the electronic component is located within the cavity.

7. The electronic device defined in claim 6 wherein the cover layer comprises a layer of cover glass that is attached to the protrusion with adhesive.

8. The electronic device define in claim 7 further comprising a color filter layer adjacent to the thin-film transistor layer, wherein the thin-film transistor layer has an edge, wherein the protrusion is interposed between the edge of the thin-film transistor layer and the layer of cover glass, and wherein the color filter layer has an edge that is recessed with respect to the edge of the thin-film transistor layer.

9. The electronic device defined in claim 8 further comprising:
   a support structure around which a portion of the flex circuit bends, wherein the electronic component comprises a capacitor that is connected to the flex circuit.

10. The electronic device defined in claim 7 wherein the adhesive comprises pressure sensitive adhesive.

11. An electronic device, comprising:
    a display having an exterior layer and at least one interior layer;
    a housing having a protrusion that is interposed between the exterior and interior layers, wherein the housing comprises a rear housing surface, wherein the interior layer is interposed between the exterior layer and the rear housing surface, and wherein the housing and the protrusion are formed from one piece;
    adhesive that attaches the exterior layer to the protrusion; and
    a capacitor coupled to the display, wherein the protrusion extends over a cavity in the housing and wherein the capacitor is located within the cavity.

12. The electronic device defined in claim 11 wherein the exterior layer comprises a layer of cover glass.

13. The electronic device defined in claim 11 wherein the exterior layer comprises a cover layer.

14. The electronic device defined in claim 11 wherein the interior layer comprises a thin-film transistor layer.

15. The electronic device defined in claim 11 wherein the adhesive comprises pressure sensitive adhesive.

16. The electronic device defined in claim 11 further comprising a flex circuit that has an end that is attached to the interior layer, wherein the protrusion is interposed between the end of the flex circuit and the exterior layer.

17. The electronic device define in claim 16 further comprising a color filter layer adjacent to the interior layer, wherein the interior layer has an edge, wherein the protrusion is interposed between the edge of the interior layer and the exterior layer, and wherein the color filter layer has an edge that is recessed with respect to the edge of the interior layer.

18. The electronic device defined in claim 17 further comprising:
    a support structure around which a portion of the flex circuit bends, wherein the capacitor is connected to the flex circuit.

* * * * *